US012812997B2

(12) United States Patent
Jeon et al.

(10) Patent No.: US 12,812,997 B2
(45) Date of Patent: Nov. 24, 2026

(54) IMAGE SENSOR AND METHOD OF MANUFACTURING THE SAME

(71) Applicant: SAMSUNG ELECTRONICS CO., LTD., Suwon-si (KR)

(72) Inventors: Jongmin Jeon, Suwon-si (KR); Hajin Lim, Suwon-si (KR); Keewon Kim, Suwon-si (KR); Kijoong Yoon, Suwon-si (KR); Taeksoo Jeon, Suwon-si (KR); Jaesung Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 18/368,372

(22) Filed: Sep. 14, 2023

(65) Prior Publication Data

US 2024/0105746 A1 Mar. 28, 2024

(30) Foreign Application Priority Data

Sep. 28, 2022 (KR) ........................ 10-2022-0123649

(51) Int. Cl.
*H10F 39/00* (2025.01)
*G02B 5/04* (2006.01)

(52) U.S. Cl.
CPC ............. *H10F 39/806* (2025.01); *G02B 5/04* (2013.01); *H10F 39/024* (2025.01)

(58) Field of Classification Search
CPC .... H10F 39/806; H10F 39/024; H10F 39/805; H10F 39/8053; H10F 39/8063; H10F 39/8067; G02B 5/04
See application file for complete search history.

(56) References Cited

U.S. PATENT DOCUMENTS 8,969,900 B2 3/2015 Sabathil et al.
9,515,218 B2 * 12/2016 Yu ......................... H10F 30/223
(Continued)

FOREIGN PATENT DOCUMENTS

JP 2008147414 A 6/2008
JP 2009-252978 A 10/2009
(Continued)

OTHER PUBLICATIONS

Gyu-Jin Choi et al., "Plasma-Enhanced Atomic Layer Deposition of TiO2 and Al-Doped TiO2 Films Using N2O and O2 Reactants," Journal of The Electrochemical Society, 156(9), pp. G138-G143 (2009).

(Continued)

*Primary Examiner* — Sue A Purvis
*Assistant Examiner* — Noor Mohammad Ismail Tahir
(74) *Attorney, Agent, or Firm* — Sughrue Mion, PLLC

(57) ABSTRACT

An image sensor includes a light detector disposed on a substrate and including a plurality of light sensing cells, an interlayer device disposed on the light detector and configured to transmit a light, and a nano prism including a first nano post and a second nano post spaced apart from each other on the interlayer device and configured to condense a light onto the light detector, the first nano post includes a first refractive layer doped with aluminum at a first doping concentration, and a second refractive layer surrounding a bottom surface and a side surface of the first refractive layer and doped with aluminum at a second doping concentration, and the first doping concentration is higher than the second doping concentration.

12 Claims, 19 Drawing Sheets

(56) References Cited

U.S. PATENT DOCUMENTS

| | | | |
|---|---|---|---|
| 10,707,118 B2 | 7/2020 | Godet et al. | |
| 10,795,168 B2 | 10/2020 | Riley, Jr. et al. | |
| 11,366,296 B2 | 6/2022 | Devlin et al. | |
| 2007/0164329 A1 | 7/2007 | Toshikiyo | |
| 2012/0032312 A1 | 2/2012 | Nogami et al. | |
| 2020/0186723 A1 | 6/2020 | Kang et al. | |
| 2021/0249459 A1 | 8/2021 | Yun et al. | |
| 2021/0395888 A1 | 12/2021 | Cho et al. | |
| 2022/0271094 A1* | 8/2022 | Dupoiron .............. | H10F 39/811 |

FOREIGN PATENT DOCUMENTS

| | | |
|---|---|---|
| JP | 5022601 B2 | 9/2012 |
| JP | 5636203 B2 | 12/2014 |
| JP | 5702622 B2 | 4/2015 |
| KR | 10-2012-0012323 A | 2/2012 |
| KR | 10-2020-0069024 A | 6/2020 |
| KR | 10-2021-0102026 A | 8/2021 |

OTHER PUBLICATIONS

Seung Keun Kim, et al. "Growth Behavior of AI-Doped TiO2 Thin Films by Atomic Layer Deposition," Chem. Mater. 2008, 20, pp. 3723-3727.

Chia-Hsun Hsu et al., "Tantalum-Doped TiO2 Prepared by Atomic Layer Deposition and Its Application in Perovskite Solar Cells," Nanomaterials 2021, 11, 1504 (Total 14 pages).

Communication dated Jun. 1, 2026 issued by the Korean Ministry of Intellectual Property in Korean Patent Application No. 10-2022-0123649.

* cited by examiner

IMAGE SENSOR AND METHOD OF MANUFACTURING THE SAME

CROSS-REFERENCE TO RELATED APPLICATION

This application is based on and claims priority under 35 U.S.C. § 119 to Korean Patent Application No. 10-2022-0123649, filed on Sep. 28, 2022, in the Korean Intellectual Property Office, the disclosure of which is incorporated by reference herein in its entirety.

BACKGROUND

The embodiments of the present disclosure relate to an image sensor, and in particular, to an image sensor having a nano prism and a method of manufacturing the image sensor.

An image sensor typically displays images of various colors or detects the color of incident light by using a color filter. Recently, attempts have been made to use a nano prism to improve light utilization efficiency of an image sensor. The nano prism may separate colors of an incident light by using diffraction or refraction characteristics of light that differ according to wavelengths, and adjust the directionality of the incident light for each wavelength according to the refractive index and shape. The colors separated by the nano prism may be transmitted to the respective corresponding pixels. In this regard, a refractive layer constituting the nano prism may be deposited by an atomic layer deposition (ALD) process.

SUMMARY

The embodiments of the present disclosure provide an image sensor having a nano prism including a refractive layer with an improved deposition rate through a doping treatment, and a method of manufacturing the image sensor.

In addition, the problem to be solved by the embodiments of the present disclosure is not limited to the above-mentioned problem, and other problems may be clearly understood by those of ordinary skill in the art from the description below.

According to one or more embodiments, an image sensor comprises a light detector disposed on a substrate, the light detector comprising a plurality of light sensing cells; an interlayer device disposed on the light detector, the interlayer device configured to transmit a light; and a nano prism comprising a first nano post and a second nano post spaced apart from each other on the interlayer device, the nano prism configured to condense a light onto the light detector, wherein the first nano post comprises; a first refractive layer doped with aluminum at a first doping concentration, and a second refractive layer surrounding a bottom surface and a side surface of the first refractive layer, the second refractive layer doped with aluminum at a second doping concentration, and wherein the first doping concentration is higher than the second doping concentration.

According to one or more embodiments, An image sensor comprising: a light detector disposed on a substrate, the light detector comprising a plurality of light sensing cells; an interlayer device disposed on the light detector, the interlayer device configured to transmit a light; and a nano prism comprising a first nano post and a second nano post spaced apart from each other on the interlayer device, the nano prism configured to condense a light onto the light detector, wherein the first nano post comprises: a first refractive layer doped with silicone at a first doping concentration, and a second refractive layer surrounding a bottom surface and a side surface of the first refractive layer, the second refractive layer doped with silicone at a second doping concentration, and wherein the first doping concentration is higher than the second doping concentration.

According to one or more embodiments an image sensor comprises a light detector disposed on a substrate, the light detector comprising a plurality of light sensing cells; an interlayer device disposed on the light detector, the interlayer device configured to transmit a light; and a nano prism comprising a first nano post and a second nano post spaced apart from each other on the interlayer device, the nano prism configured to condense a light onto the light detector, wherein the first nano post comprises a first refractive layer doped with aluminum at a first doping concentration and a second refractive layer surrounding a bottom surface and a side surface of the first refractive layer, the second refractive layer doped with aluminum at a second doping concentration, wherein the first doping concentration is higher than the second doping concentration, wherein the second refractive layer has a higher refractive index than the first refractive layer, wherein upon the light from an outer layer being incident to the interlayer device through the first refractive layer and the second refractive layer of the first nano post, the nano prism is configured such that a first angle of incidence at an interface between the outer layer and the first refractive layer is greater than a second angle of incidence at an interface between the first refractive layer and the second refractive layer, wherein each of the first refractive layer and the second refractive layer comprises $SiN_3$, $Si_3N_4$, ZnS, GaN, ZnSe, $TiO_2$, or a combination thereof, wherein the first doping concentration of the first refractive layer is about 5 percent to about 30 percent, and the second doping concentration of the second refractive layer is 0 percent to about 10 percent, wherein each of the first nano post and the second nano post has a cylindrical shape, an upper surface of the first nano post is wider than an upper surface of the second nano post, and each of the first nano post and the second nano post has a size smaller than a wavelength of a visible light, and wherein the nano prism comprises a plurality of color separation regions each corresponding to a respective light sensing cell form the plurality of light sensing cells, each of the plurality of color separation regions comprises at least one first nano post and at least one second nano post, and the plurality of color separation regions condense light of different wavelength spectrums onto adjacent light sensing cells among the plurality of light sensing cells.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments of the present disclosure will be described in detail with reference to the accompanying drawings. However, the present disclosure does not have to be configured as limited to the embodiments described below and may be embodied in various other forms. The following embodiments are not provided to fully complete the present disclosure, but rather to fully convey the scope of the present disclosure to those of ordinary skill in the art.

Figure 1:
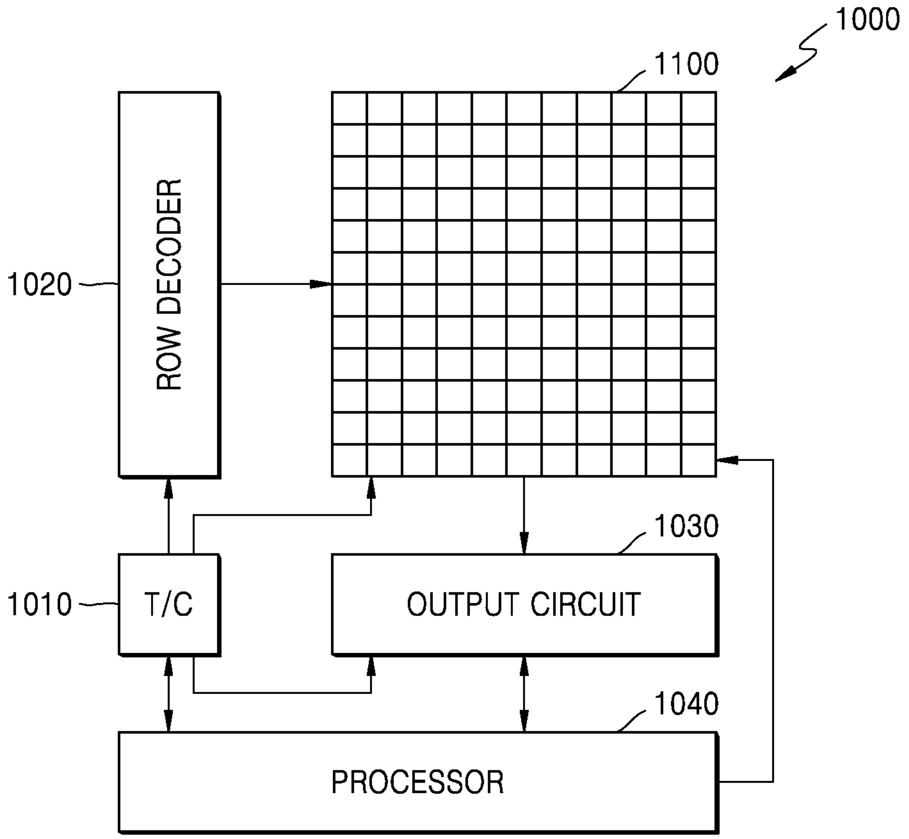
FIG. 1 is a block diagram of an image sensor according to one or more embodiments.

FIG. 1 is a block diagram of an image sensor 1000 according to one or more embodiments.

Referring to FIG. 1, the image sensor 1000 of the present one or more embodiments may include a pixel array 1100, a timing controller 1010, a row decoder 1020, an output circuit 1030, and a processor 1040. The processor 1040 may control the pixel array 1100, the timing controller 1010, and the output circuit 1030 and process an image signal output through the output circuit 1030. The image sensor 1000 of the present one or more embodiments may be, for example, a charge coupled device (CCD) image sensor or a complementary metal oxide semiconductor (CMOS) image sensor.

According to one or more embodiments, the pixel array 1100 may include a plurality of pixels arranged in a two-dimensional (2D) array structure along a plurality of rows and a plurality of columns. The row decoder 1020 may select at least one row from among a plurality of rows of the pixel array 1100 in response to a row address signal output from the timing controller 1010. The output circuit 1030 may output light sensing signals in units of columns from a plurality of pixels connected to the selected row. The output circuit 1030 may include an analog to digital converter (ADC). For example, the output circuit 1030 may include a plurality of ADCs arranged according to the respective columns, and each ADC may include a comparator comparing a pixel light sensing signal for a respective pixel with a reference signal and a converter converting a comparator output signal into digital data.

Figure 2:
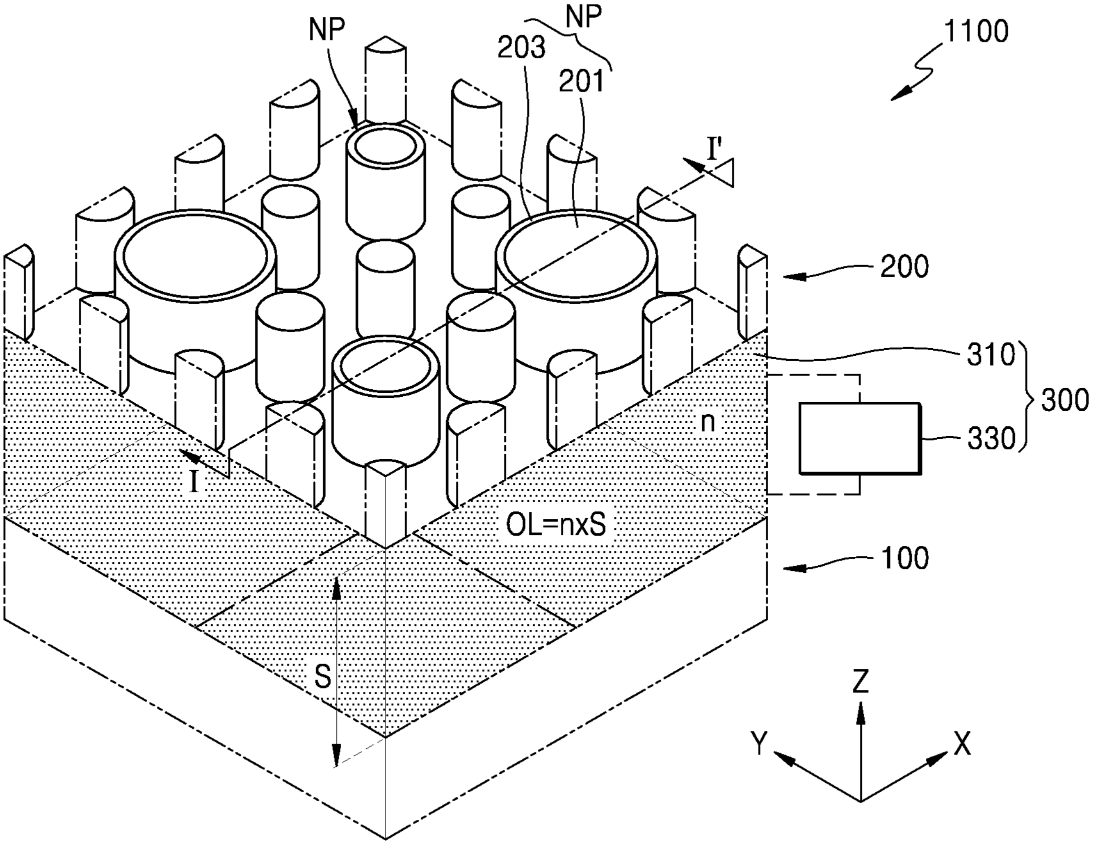
FIG. 2 is a conceptual diagram schematically illustrating a pixel array in the image sensor of FIG. 1, according to one or more embodiments.
Figure 3:
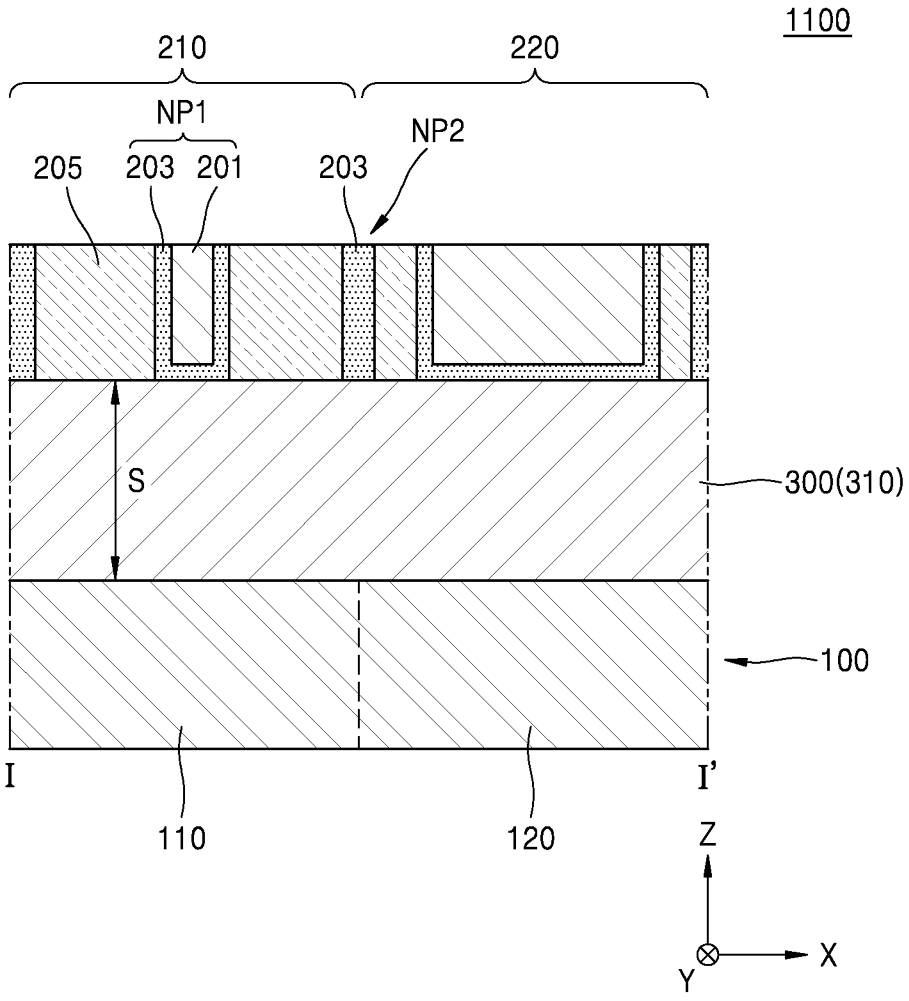
FIG. 3 is a cross-sectional view taken along a line I-I' of FIG. 2, according to one or more embodiments.
Figure 4:
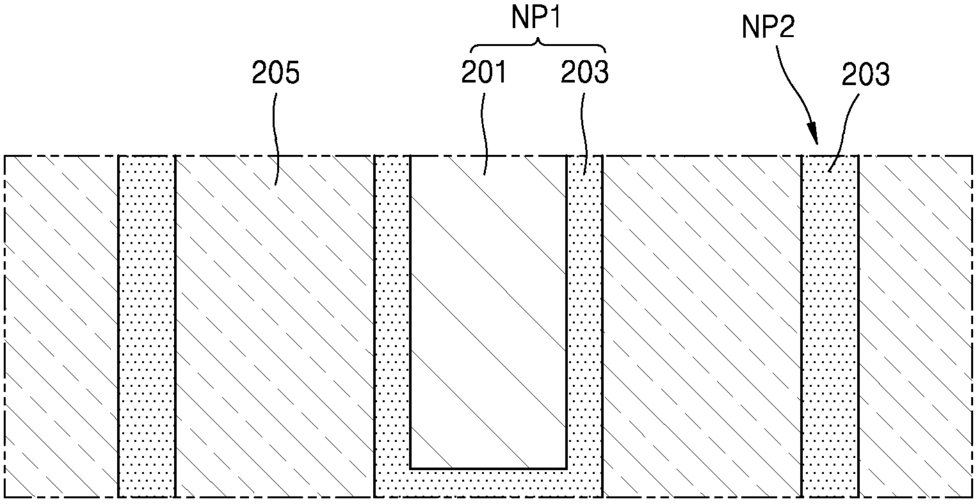
FIG. 4 is an enlarged cross-sectional view of a nano prism of FIG. 3, according to one or more embodiments.
Figure 5:
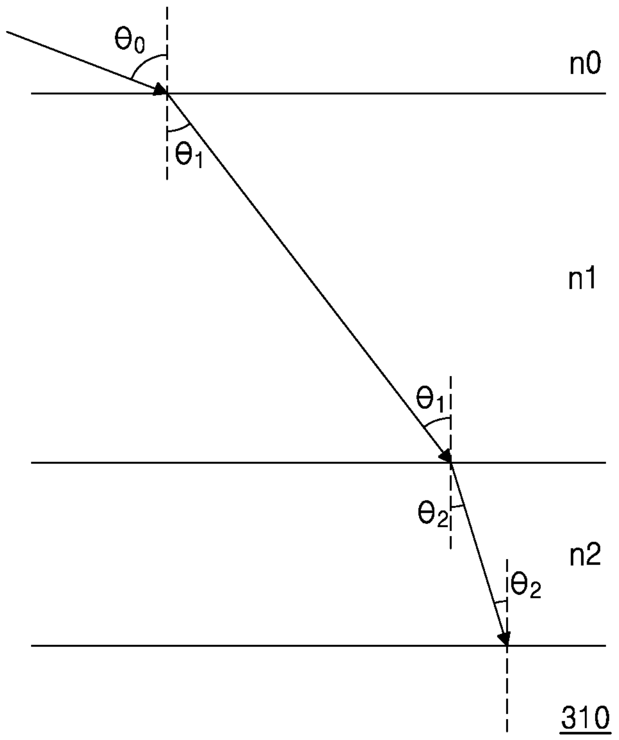
FIG. 5 is a conceptual diagram illustrating an effect of the nano prism in the image sensor of FIG. 1, according to one or more embodiments.

FIG. 2 is a conceptual diagram schematically illustrating a pixel array in the image sensor of FIG. 1, FIG. 3 is a cross-sectional view taken along a line I-I' of FIG. 2, FIG. 4 is an enlarged cross-sectional view of a nano prism of FIG. 3, and FIG. 5 is a conceptual diagram illustrating an effect of the nano prism in the image sensor of FIG. 1. FIGS. 2 to 5 will be described with reference to FIG. 1 together, and the descriptions already given in FIG. 1 will be briefly provided or omitted.

Referring to FIGS. 2 to 5, the pixel array 1100 may include a light detector 100, a nano prism 200, and an interlayer device 300 disposed on a substrate. The light detector 100 disposed on the substrate may include a plurality of light sensing cells that sense light. In the image sensor 1000 of the present one or more embodiments, each light sensing cell may be, for example, a photo-diode (PD). However, the present disclosure is not necessarily limited to the above, and may include any suitable hardware known to one of ordinary skill in the art for sensing light. The interlayer device 300 may be disposed on the light detector 100 and configured to have the light transmitted. The nano prism 200 may include a first nano post NP1 and a second nano post NP2 spaced apart from each other on the interlayer device 300, and may be configured to have the light condensed onto the light detector 100. The interlayer device 300 may adjust an optical length OL between the light detector 100 and the nano prism 200. For example, the optical length OL may be expressed as a product of a refractive index n and a distance S of a variable interlayer 310 of the interlayer device 300. Further detail is provided below regarding varying the distance S. The thickness of the second nano post NP2 may be constant in a direction perpendicular to the upper surface of the interlayer device 300.

The nano prism 200 may diverge an incident light to make light of different wavelength spectrums incident to at least two different light sensing cells 110 and 120 of the light detector 100. For example, in the nano prism 200, the size, position, and arrangement of each of the first nano post NP1 and the second nano post NP2 may be appropriately set. The nano prism 200 may include first and second color separation regions 210 and 220 respectively facing the first and second light sensing cells of the light detector 100. Furthermore, according to the arrangement relationships between the first and second color separation regions 210 and 220 and the plurality of nano posts NP1 and NP2, the incident light may be incident on the first and second light sensing cells 110 and a 120 of the light detector 100 through the nano prism 200, and have a wavelength spectrum determined according to a certain distance.

According to one or more embodiments, the nano prism 200 may include the first nano post NPT, the second nano post NP2, and a spacer layer 205. Each of the first nano post NPT and the second nano post NP2 may have a cylindrical shape, but is not necessarily limited to the above shape. The first nano post NPT and the second nano post NP2 may have various sizes (e.g., the first and second nano posts may have sizes different from each other) and be spaced apart from each other on the upper surface of the interlayer device 300. The spacer layer 205 may be disposed between the first nano post NP1 and the second nano post NP2 and may contact the first nano post NPT and the second nano post NP2. For example, the upper surfaces of a first refractive layer 201 and a second refractive layer 203 of the first nano post NPT and the spacer layer 205 may have substantially the same level (e.g., substantially planar). For example, a layer has substantially the same level or is substantially planar when a gradient of atop surface of the layer is 5% or less. The thickness of the second nano post NP2 may be constant in a direction perpendicular to the upper surface of the interlayer device 300, and the thickness of the second refractive layer 203 may be constant in a direction perpendicular to the upper surface of the interlayer device 300. The spacer layer 205 may include a material having a lower refractive index than those of materials of the first refractive layer 201 and the second refractive layer 203 included in the first nano post NP1 and the second refractive layer 203 included in the second nano post NP2. For example, the spacer layer 205 may include $SiO_2$. However, the material constituting the spacer layer 205 is not necessarily limited to this material and may include any suitable material known to one of ordinary skill in the art.

According to one or more embodiments, the first nano post NP1 may include the first refractive layer 201 and the second refractive layer 203. The first refractive layer 201 may form a central body of the first nano post NP1 and may have a cylindrical shape corresponding to the shape of the first nano post NP1. However, when the shape of the first nano post NP1 is not cylindrical, the shape of the first refractive layer 201 may not be cylindrical. The second refractive layer 203 may have a shape surrounding the bottom and side surfaces of the first refractive layer 201. For example, the second refractive layer 203 may have a hollow cylindrical shape that houses the first refractive layer 201.

According to one or more embodiments, the first refractive layer 201 and the second refractive layer 203 may include materials having a higher refractive index than the material of the spacer layer 205. In general, a high refractive index may be defined in terms of $SiO_2$. For example, each of the first refractive layer 201 and the second refractive layer 203 may include $TiO_2$ doped with aluminum (Al) or silicon (Si). However, the present disclosure is not necessarily limited to the above, and each of the first refractive layer 201 and the second refractive layer 203 may include $SiN_3$, $Si_3N_4$, ZnS, GaN, ZnSe, $TiO_2$, or a combination thereof. Furthermore, the second refractive layer 203 may have a higher refractive index than the first refractive layer 201.

The following descriptions are made with reference to FIGS. 9A to 9D. The first nano post NP1 may include the first refractive layer 201 doped with aluminum at a first doping concentration and the second refractive layer 203 surrounding the bottom surface and side surfaces of the first refractive layer 201 and doped with aluminum at a second doping concentration. For example, the first doping concentration may be higher than the second doping concentration. A second material layer 203*a* constituting the second refractive layer 203 may be deposited on a plurality of recesses R1 and R2 formed in the spacer layer 205 by an atomic layer deposition (ALD) process. In one or more examples, the spacer layer 205 may be deposited on the interlayer device 300 as a substantially planar layer with the recesses R1 and R2 subsequently formed by the ALD process. Furthermore, a third material layer 201*a* constituting the first refractive layer 201 may be deposited on the second material layer 203*a* by the ALD process.

In one or more examples, when the second material layer 203*a* and the third material layer 201*a* are doped with aluminum or silicon, a deposition rate of each of the second material layer 203*a* and the third material layer 201*a* may increase by the ALD process. As the doping concentration of aluminum or silicon increases, the deposition rate may increase proportionally by the ALD process. The first doping concentration of aluminum or silicon of the third material layer 201*a* constituting the first refractive layer 201 may be higher than the second doping concentration of aluminum or silicon of the second material layer 203*a* constituting the second refractive layer 203. As a result, the rate at which the first refractive layer 201 is deposited on the second refractive layer 203 may be higher than the rate at which the second refractive layer 203 is deposited on the interlayer device 300. For example, the first doping concentration of the first refractive layer 201 may be about 5 percent (e.g., 4-6 percent) to about 30 percent (e.g., 29-31 percent), and the second doping concentration of the second refractive layer 203 may be 0 percent to about 10 percent (e.g., 9-11 percent). As the doping concentration of aluminum or silicon increases, the deposition rate of each of the first refractive layer 201 and the second refractive layer 203 increases by the ALD process, and the refractive index thereof decreases. A part of the first refractive layer 201 having a low refractive index may be removed by a chemical mechanical polishing (CMP) process. As a result, the productivity of the nano prism 200 may be improved while the refractive index of the nano prism 200 remains substantially the same.

Figure 9A:
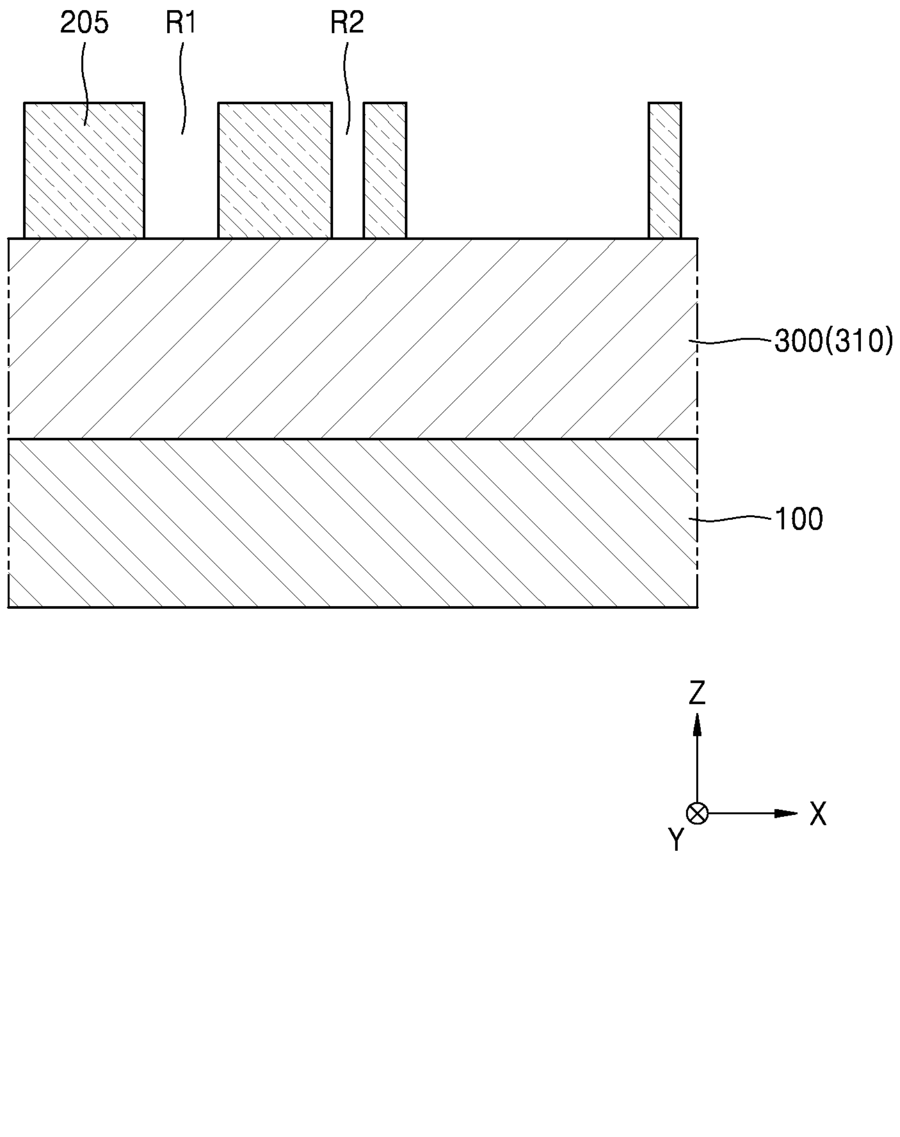
FIGS. 9A to 9E are cross-sectional views schematically illustrating a process of a method of manufacturing an image sensor, according to one or more embodiments.
Figure 9B:
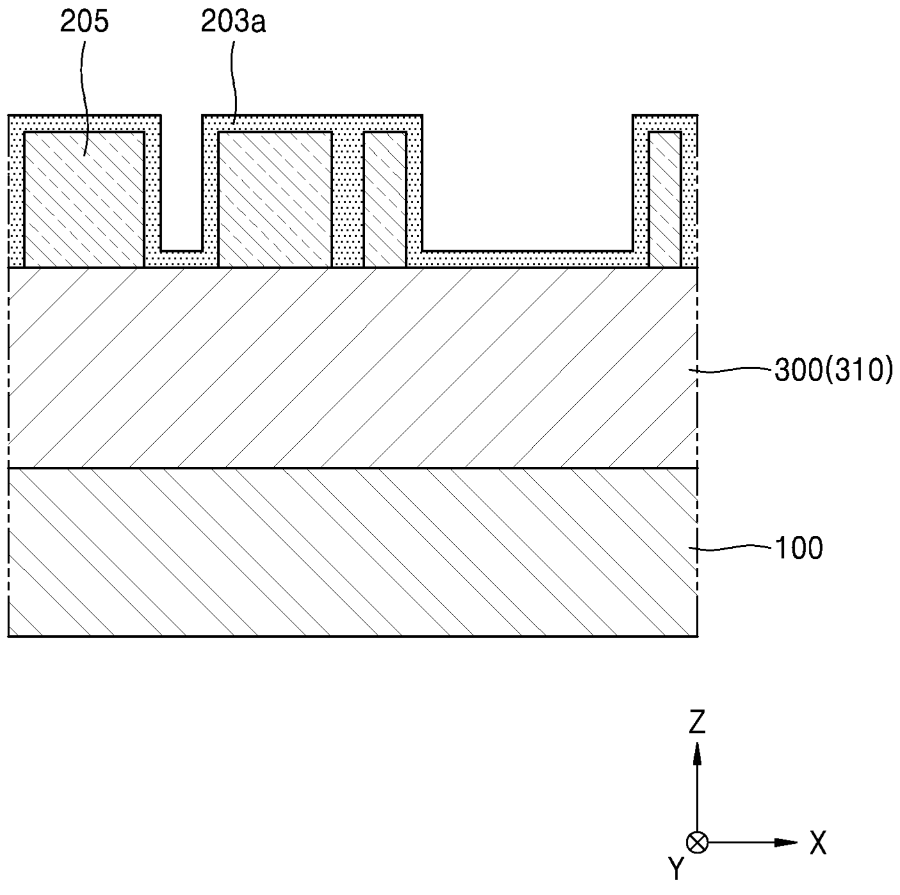
Figure 9C:
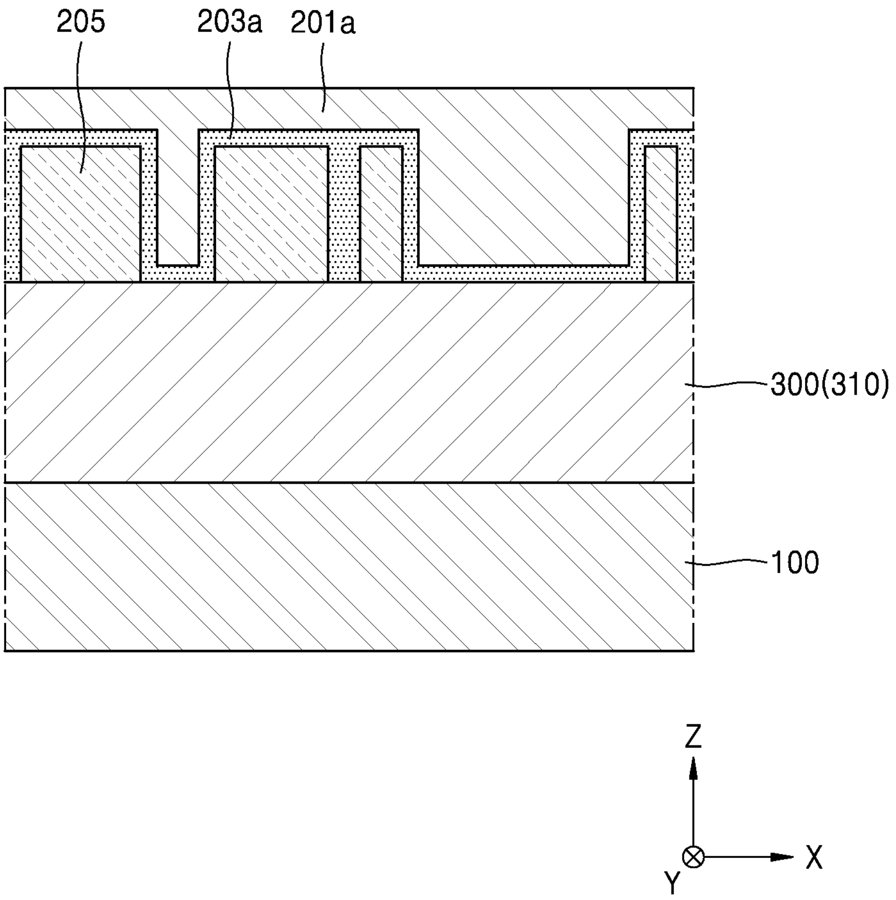
Figure 9D:
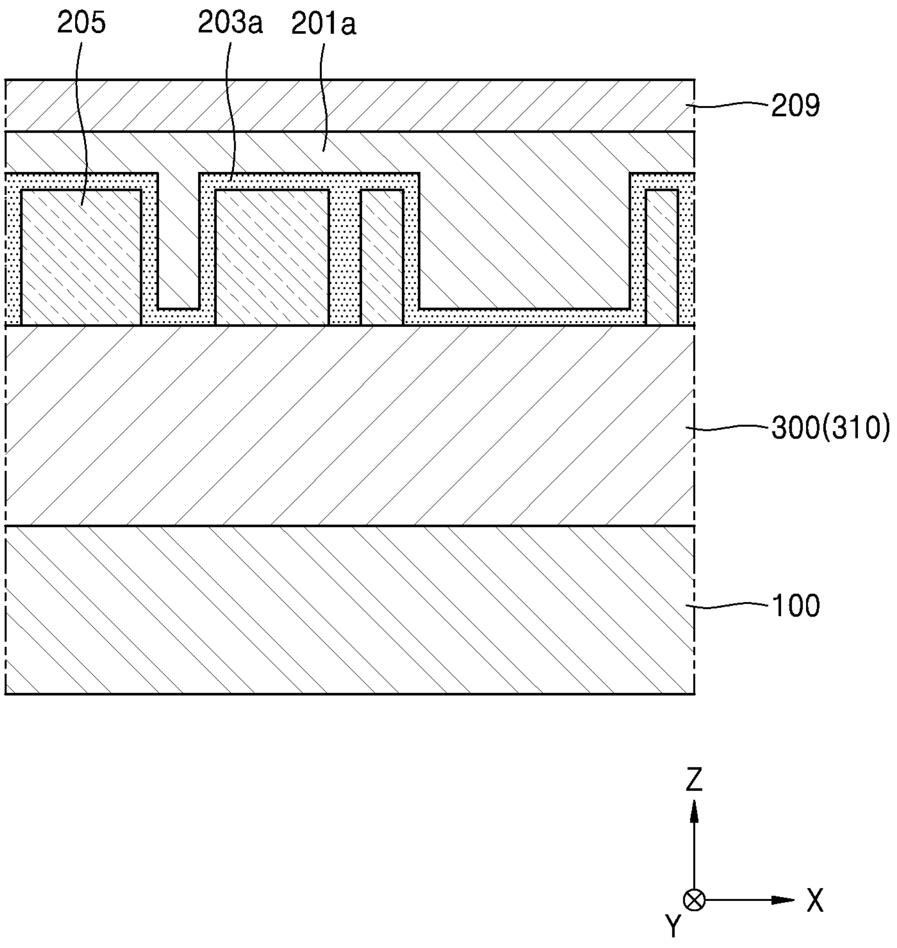

As shown in FIG. 9D, a third refractive layer 209 may be formed on the third material layer 201*a*. The third refractive layer 209 may cover the third material layer 201*a* constituting the first refractive layer 201 and may be doped with aluminum or silicon at a third doping concentration. For example, the third doping concentration of the third refractive layer 209 may be higher than the first doping concentration of the first refractive layer 201. Accordingly, the rate at which the third refractive layer 209 is deposited on the first refractive layer 201 may be higher than the rate at which the first refractive layer 201 is deposited on the second refractive layer 203.

According to one or more embodiments, the third refractive layer 209 may include a material having a higher refractive index than the material of the spacer layer 205. In general, a high refractive index may be defined in terms of $SiO_2$. For example, the third refractive layer 209 may include $TiO_2$ doped with aluminum (Al) or silicon (Si). However, the present disclosure is not necessarily limited to the above, and the third refractive layer 209 may include $SiN_3$, $Si_3N_4$, ZnS, GaN, ZnSe, $TiO_2$, or a combination thereof. Furthermore, the first refractive layer 201 may have a higher refractive index than the third refractive layer 209. The first and second refractive layers 201 and 203 and the third refractive layer 209 may be doped with aluminum or silicon to increase the deposition rate of each of the first and second refractive layers 201 and 203 and the third refractive layer 209, thereby improving the productivity of the image sensor. For example, as understood by one of ordinary skill in the art, the higher the doping concentration of aluminum or silicon, the higher the deposition rate of each of the first refractive layer 201, the second refractive layer 203, and the third refractive layer 209 by the ALD process, and the lower the refractive index thereof. In one or more examples, an entirety of the third refractive layer 209 having a low refractive index and a part of the first refractive layer 201 may be removed by the CMP process. As a result, the productivity of the nano prism 200 may be improved while the refractive index of the nano prism 200 is substantially maintained.

According to one or more embodiments, the second nano post NP2 may include the second refractive layer 203 doped with aluminum at a second doping concentration. Unlike the first nano post NP1, the second nano post NP2 may not include the first refractive layer 201 doped with aluminum at the first doping concentration, but is not necessarily limited thereto. In one or more examples, the second nano post NP2 may include both the second refractive layer 203 and the first refractive layer 201.

FIG. 5 illustrates refraction characteristics of light in a structure in which a first nano post is formed in a double layer of a first refractive layer n1 and a second refractive layer n2. As illustrated in FIG. 5, the first refractive layer n1 may be doped with aluminum at a first doping concentration, and the second refractive layer n2 may be doped with aluminum at a second doping concentration lower than the first doping concentration. Furthermore, an outer layer n0 may be, for example, an air layer. However, the materials of the outer layer n0, the first refractive layer n1, and the second refractive layer n2 are not limited to the above configurations.

According to one or more embodiments, in the first nano post NP1 having a double layer structure, light may be refracted at a first boundary surface between the outer layer n0 and the first refractive layer n1, again refracted at a second boundary surface between the first refractive layer n1 and the second refractive layer n2, and subsequently incident on the variable interlayer 310. At the first boundary surface, $\theta_0$ may denote a first angle of incidence, at the second boundary surface, $\theta_1$ may denote a second angle of incidence, and $\theta_2$ may correspond to a third angle of incidence. The third angle of incidence may also be substantially the same as the angle of incidence to the variable interlayer 310. As such, the refraction of light incident from the outer layer n0 may increase by making the refractive index of the second refractive layer n2 higher than that of the first refractive layer n1, and thus, the angle of incidence to the variable interlayer 310 may be minimized.

In the image sensor 1000 of the present one or more embodiments, the pixel array 1100 may include the variable interlayer device 300 varying the optical length OL. The variable interlayer device 300 may include the variable interlayer 310 and a variable driver 330 driving a variable to the variable interlayer 310. The variable driver 330 may include structures connected to the variable interlayer 310 in various forms and/or a variable signal application unit to adjust the optical length OL.

The variable driver 330 may be controlled by the processor 1040. The processor 1040 may control, for example, the variable driver 330 to form the required optical length OL. Furthermore, the processor 1040 may control the variable driver 330 to form a plurality of different optical lengths OL. The set optical length OL (e.g., one optical length OL from the plurality of optical lengths OL) may be utilized when the processor 1040 processes a signal from the light detector 100.

The variable driver 330 may vary the refractive index of the variable interlayer 310 disposed between the light detector 100 and the nano prism 200. Furthermore, the variable driver 330 may vary the physical distance S between the light detector 100 and the nano prism 200. In the variable interlayer 310 and structures of various forms connected to the variable interlayer 310, elements positioned between the nano prism 200 and the light detector 100 may include a light transmissive material.

Figure 6A:
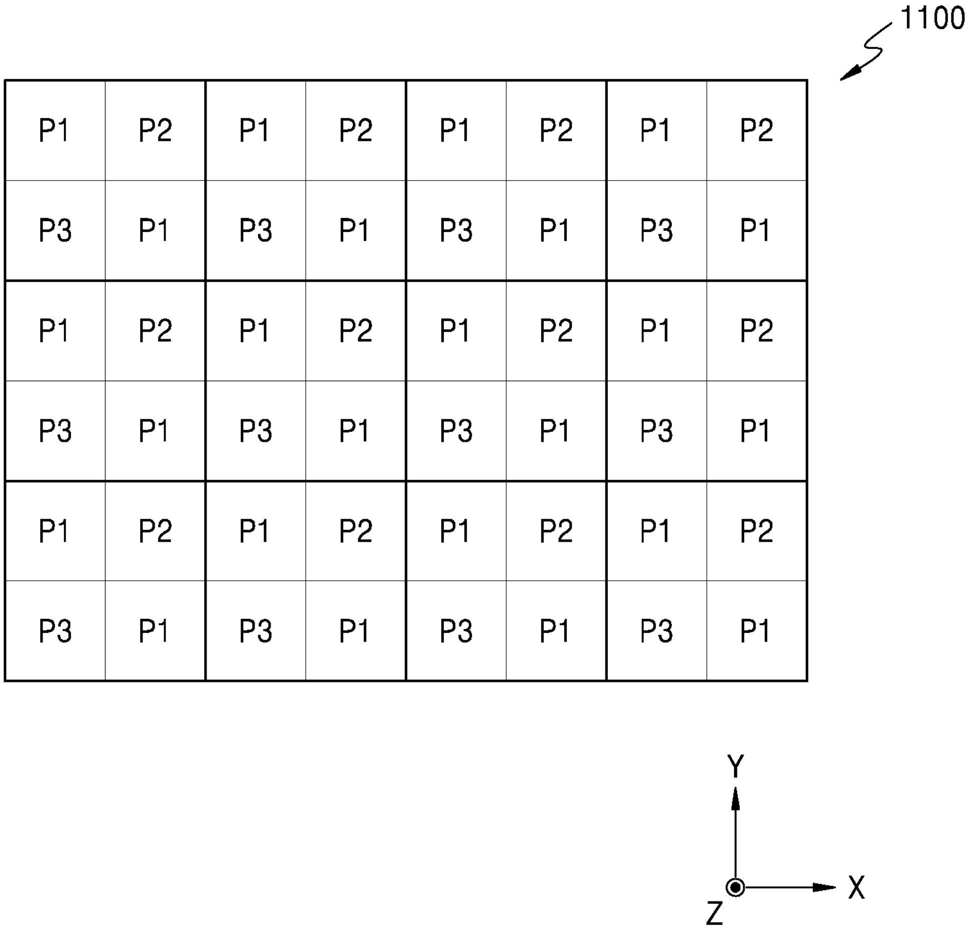
FIGS. 6A and 6B are plan views illustrating an arrangement of pixels and an arrangement of light sensing cells corresponding to pixel regions in the image sensor of FIG. 1, according to one or more embodiments.
Figure 6B:
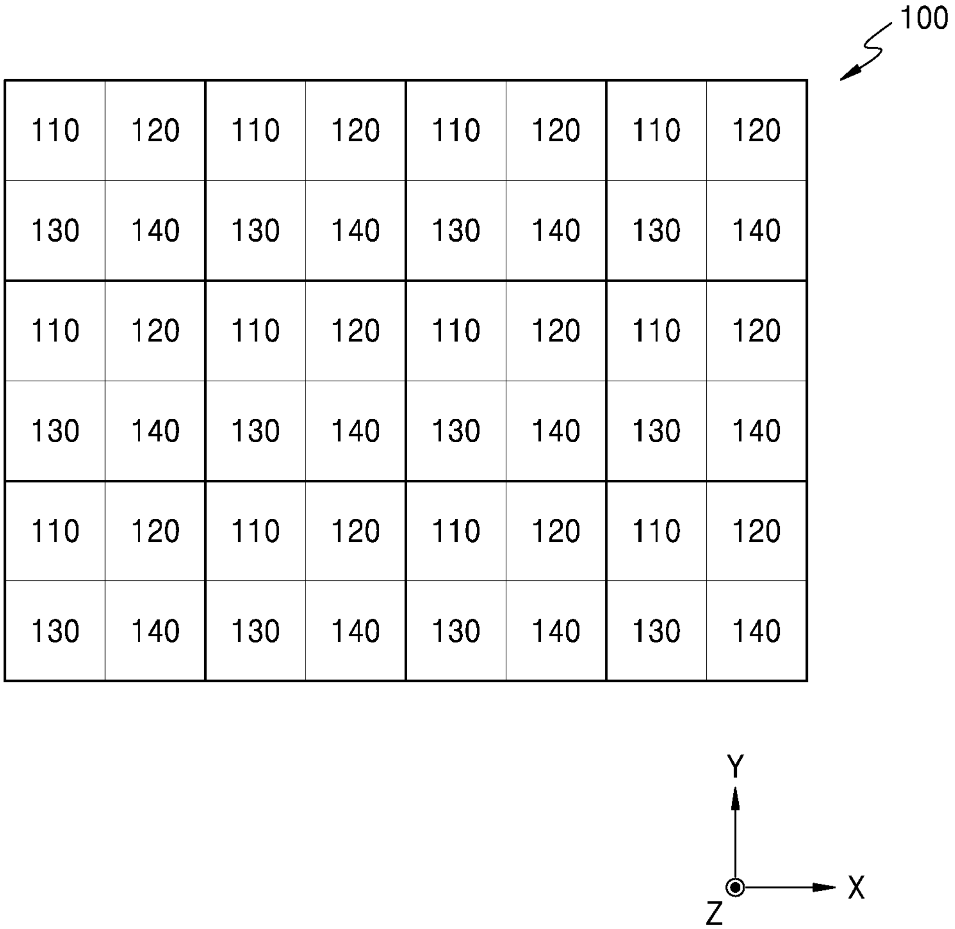
Figure 6C:
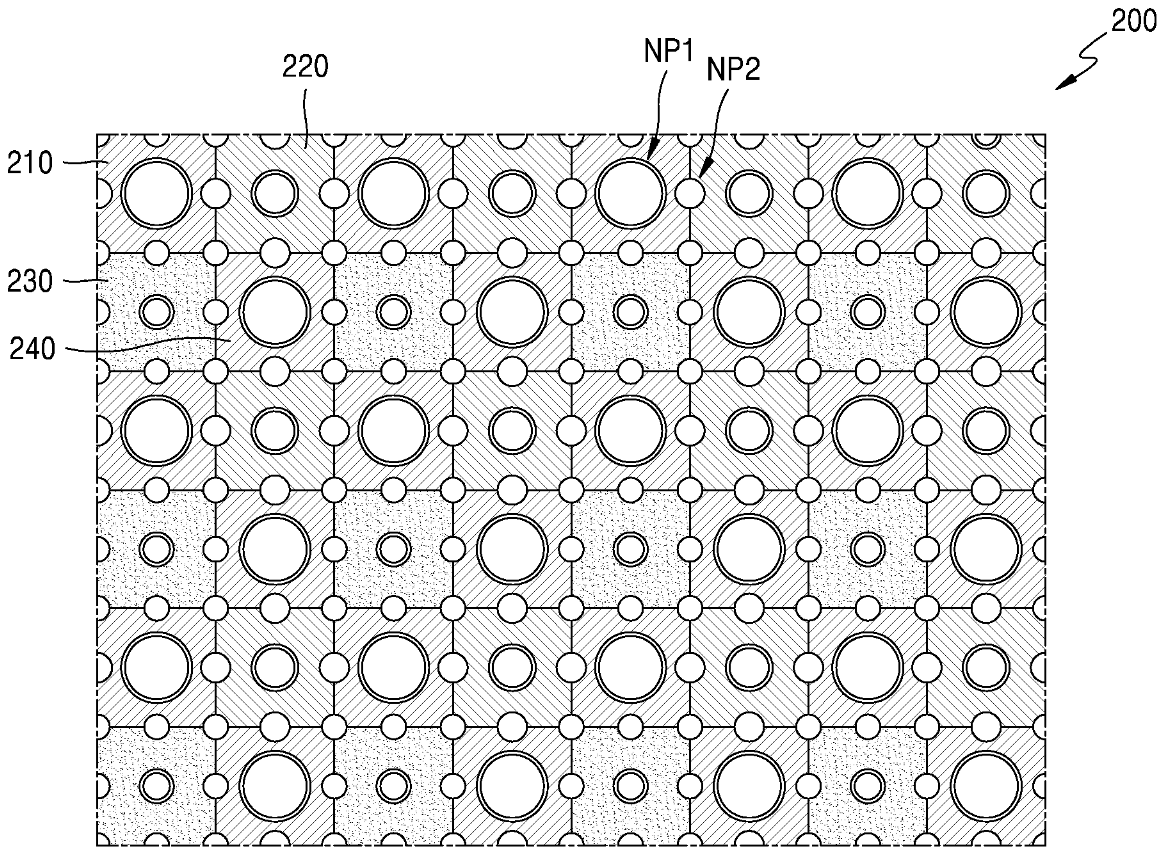
FIG. 6C is a plan view illustrating an arrangement of nano posts in a nano prism of the image sensor of FIG. 1.
Figure 6D:
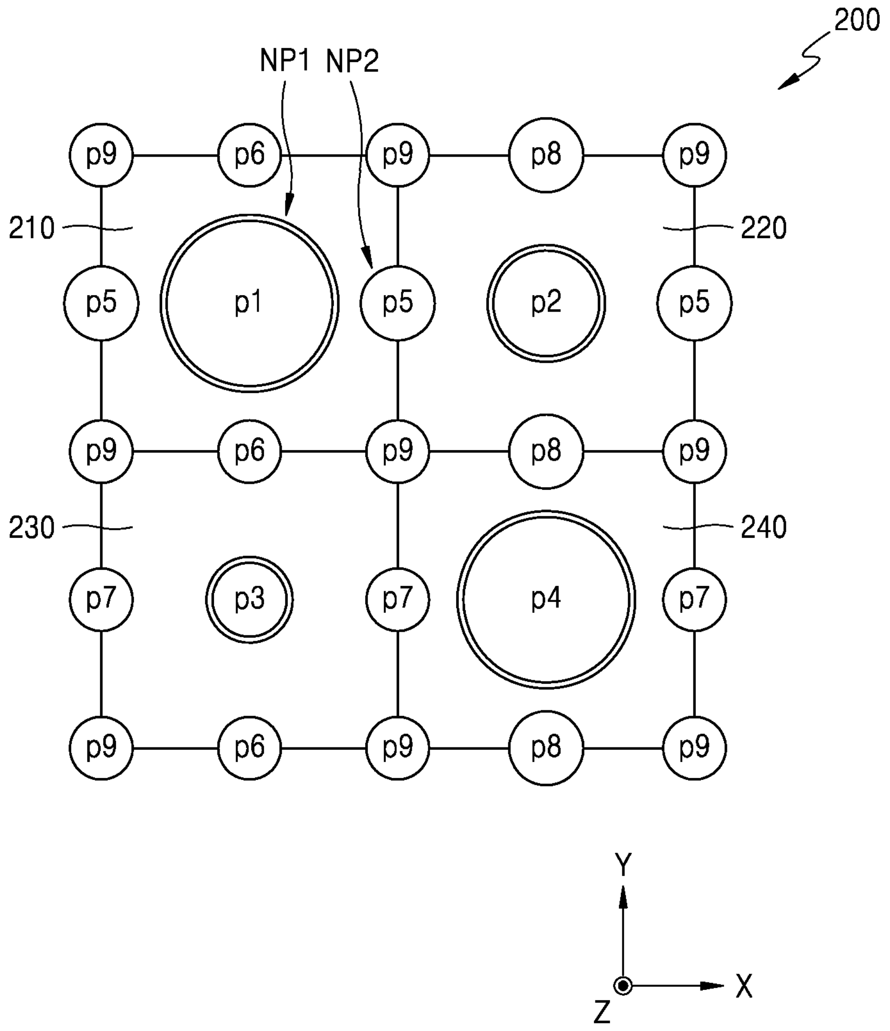
FIG. 6D is an enlarged plan view illustrating a partial region of FIG. 6C, according to one or more embodiments.

FIGS. 6A and 6B are plan views illustrating an arrangement of pixels and an arrangement of light sensing cells corresponding to pixel regions in the image sensor 1000 of FIG. 1. FIG. 6C is a plan view illustrating an arrangement of the nano posts NP1 and NP2 in the nano prism 200 of the image sensor 1000 of FIG. 1, and FIG. 6D is an enlarged plan view illustrating a partial region of FIG. 6C. FIGS. 6A to 6D will be described with reference to FIGS. 1 to 4 together, and the descriptions already given in FIGS. 1 to 4 will be briefly provided or omitted.

Referring to FIGS. 6A to 6D, the pixel array 1100 may include the light detector 100 and the nano prism 200. The light detector 100 may include the first and second light sensing cells 110 and 120 that sense light.

According to one or more embodiments, as illustrated in FIG. 6B, the light detector 100 may include the first light sensing cell 110, the second light sensing cell 120, a third light sensing cell 130, and a fourth light sensing cell 140 that convert light into electrical signals. The first light sensing cell 110 and the second light sensing cell 120 may be alternately disposed in a first direction (X direction). In addition, the third light sensing cell 130 and the fourth light sensing cell 140 may also be alternately disposed in the first direction (X direction). Furthermore, the first light sensing cell 110 and the third light sensing cell 130 may be alternately disposed in a second direction (Y direction), and the second light sensing cell 120 and the fourth light sensing cell 140 may be alternately disposed in the second direction (Y direction). Such an region division may be for sensing an incident light in units of pixels.

For example, the first light sensing cell 110 and the fourth light sensing cell 140 may sense light of a first spectrum corresponding to a first pixel P1, the second light sensing cell 120 may sense light of a second spectrum corresponding to a second pixel P2, and the third light sensing cell 130 may sense light of a third spectrum corresponding to a third pixel P3. In one or more examples, the light of the first spectrum may be a green light, the light of the second spectrum may be a blue light, and the light of the third spectrum may be a red light. However, the present disclosure is not limited to these colors, and may include any other suitable colors.

In the image sensor 1000 of the present one or more embodiments, the optical length OL between the light detector 100 and the nano prism 200 may be variable, and the first spectrum, the second spectrum, and the third spectrum may be a mixture of the green light, the red light, and the blue light in different ratios. Furthermore, the ratios may vary depending on the optical length OL. In one or more examples, cell separation layers separating light sensing cells from each other may be formed at boundaries between the light sensing cells.

The nano prism 200 may include the plurality of first nano posts NPT and second nano posts NP2 arranged according to a predetermined configuration. For example, the predetermined configuration may specify parameters such as the shape, size (width and height), space, and arrangement of the nano posts NP. Such parameters may be determined according to a target phase distribution that the nano prism 200 is configured to implement with respect to the incident light. The target phase distribution may refer to a phase distribution at a position immediately after the incident light passes through the nano prism 200.

According to one or more embodiments, the first nano post NPT and the second nano post NP2 may have a shape dimension of a sub-wavelength. The sub-wavelength may corresponds to a value smaller than the wavelength of the incident light, such as, light to form a required phase distribution. For example, at least one of dimensions defining the shapes of the first nano post NP1 and the second nano post NP2 may be the sub-wavelength. In the image sensor 1000 of the present one or more embodiments, each of the first nano post NP1 and the second nano post NP2 may be in the shape of a cylinder, and the height and diameter of the cylinder may be about 200 nm (e.g., 199 nm-201 nm). For example, the upper surface of the first nano post NP1 may be wider than the upper surface of the second nano post NP2. However, the dimensions of the first nano post NP1 and the second nano post NP2 are not limited to the above configuration.

Referring to FIG. 3, the first nano post NP1 and the second nano post NP2 may be supported by the variable interlayer 310 disposed between the light detector 100 and the first nano post NP1 and the second nano post NP2. For example, the variable interlayer 310 may include any one of glass (e.g., fused silica, BK7, etc.), quartz, polymer (e.g., PMMA, SU-8, etc.), and plastic. A refractive index of the material of the variable interlayer 310 may be lower than a refractive index of the material constituting each of the first nano post NP1 and the second nano post NP2. According to one or more embodiments, the variable interlayer 310 may be air, and in this case, a separate support layer supporting the first nano post NP1 and the second nano post NP2 may be disposed. In one or more examples, a passivation layer may be provided to protect the first nano post NP1 and the second nano post NP2. The passivation layer may include a material of a lower refractive index than the refractive index of the materials of each of the first and second nano posts NP1 and NP2.

The first nano post NP1 and the second nano post NP2 having a difference in the refractive index from the surrounding material may change the phase of light passing through the first nano post NP1 and the second nano post NP2. This change may be due to a phase delay caused by the shape dimension of the sub-wavelength of each of the first nano post NP1 and the second nano post NP2. A degree of the phase delay may be determined by the detailed shape dimensions of the first nano post NP1 and the second nano post NP2, the arrangement type, etc. The nano prism 200 may implement a required phase distribution with respect to the incident light by appropriately setting the degree of phase delay caused by each of the plurality of first nano posts NP1 and second nano posts NP2.

For example, the shape, size, and arrangement of the plurality of first nano posts NP1 and second nano posts NP2 may be determined to form an appropriate phase distribution. Through such a formation of the phase distribution, the plurality of nano posts NPs may condense light of different spectrums onto the first light sensing cell 110 and the second light sensing cell 120 adjacent to each other. Furthermore, through such a formation of the phase distribution, the plurality of first nano posts NP1 and second nano posts NP2 may condense light of different spectrums onto the third light sensing cell 130 and the fourth light sensing cell 140 adjacent to each other.

As shown in FIG. 6C, the nano prism 200 may be classified as first to fourth color separation regions 210, 220, 230, and 240 in a one-to-one correspondence with and respectively facing the first to fourth light sensing cells 110, 120, 130, and 140. For example, each cell illustrated in FIG. 6C corresponds to a respective cell in FIG. 6B. One or more first nano posts NP1 and one or more second nano posts NP2 may be disposed in each of the first to fourth color separation regions 210, 220, 230, and 240. At least one of the shape, size, and arrangement of the first nano post NP1 and the second nano post NP2 may vary according to regions on the pixel array 1100.

As seen from FIGS. 3 and 6C, the first color separation region 210 and the first light sensing cell 110 may be disposed to correspond to each other, and the second color separation region 220 and the second light sensing cell 120 may be disposed to correspond to each other. Furthermore, the third color separation region 230 and the third light sensing cell 130 may be disposed to correspond to each other, and the fourth color separation region 240 and the fourth light sensing cell 140 may be disposed to correspond to each other.

The nano prism 200 may include a plurality of unit pattern arrays arranged in two dimensions. Each unit pattern array may include four regions arranged in the shape of 2×2, for example, the first color separation region 210, the second color separation region 220, the third color separation region 230, and the fourth color separation 240.

In FIGS. 6B and 6C, the first to fourth color separation regions 210, 220, 230, and 240 and the first to fourth light sensing cells 110, 120, 130, and 140 face each other in the same size and in the vertical direction. However, this structure is an example and the present disclosure is not limited to such a structure. For example, a plurality of color separation regions defined in different shapes may respectively correspond to a plurality of light sensing cells, which is applicable to the embodiments below.

The nano prism 200 may be divided into regions so that the light of the first spectrum is diverged and condensed onto the first light sensing cell 110 and the fourth light sensing cell 140, and the light of the second spectrum is diverged and condensed onto the second light sensing cell 120, and the light of the third spectrum is diverged and condensed onto the third light sensing cell 130. Furthermore, in one or more examples, the shape and the arrangement of each of the first nano post NP1 and the second nano post NP2 may be determined for each region.

As shown in FIG. 6A, the pixel arrangement of the pixel array 1100 may be similar to a Bayer pattern. One unit pixel may include four quadrant regions. For example, the quadrant regions may be allocated to two first pixels P1, one second pixel P2, and one third pixel P3. These unit pixels may be two-dimensionally repeatedly arranged in the first direction (X direction) and the second direction (Y direction).

The two first pixels P1 may be disposed in one diagonal direction, and one second pixel P2 and one third pixel P3 may be disposed in the other diagonal direction, within a unit pixel in the form of a 2×2 array. With respect to the overall pixel arrangement, first rows in which the first pixels P1 and the second pixels P2 are alternately arranged in the first direction (X direction), and second rows in which the third pixels P3 and the first pixels P1 are alternately arranged in the first direction (X direction) may be repeatedly arranged in the second direction (Y direction). The color of each of the first pixel P1, the second pixel P2, and the third pixel P3 is not fixed to one color, and may vary depending on the optical length OL between the light detector 100 and the nano prism 200. The color or the wavelength distribution of each of the first pixel P1, the second pixel P2, and the third pixel P3 may be expressed as the first spectrum, the second spectrum, and the third spectrum, respectively. In addition, the first spectrum, the second spectrum, and the third spectrum may have specific wavelength distribution shapes varying depending on the optical length OL. Although FIG. 6A illustrates pixel P1 alternating with pixel P2, and pixel P3 alternating with pixel P1, the order of the pixels may be reversed where pixel P2 alternates with pixel P1 and pixel P1 alternates with pixel P3.

Referring to FIG. 6B, the plurality of first light sensing cells 110, second light sensing cells 120, and third light sensing cells 130 may be two-dimensionally arranged in first direction (X direction) and the second direction (Y direction) so that rows in which the first light sensing cells 110 and the second light sensing cells 120 are alternately arranged, and rows in which the third light sensing cells 130 and the fourth light sensing cells 140 are alternately arranged are alternately repeated. Accordingly, the first light sensing cell 110 or the fourth light sensing cell 140 may correspond to the first pixel P1, and the second light sensing cell 120 may correspond to the second pixel P2, and the third light sensing cell 130 may correspond to the third pixel P3. In one or more examples, the order of the light sensing cells may be reversed where the second light sensing cell 120 alternates with the first light sensing cell 110 and the fourth light sensing cell 140 alternates with the third light sensing cell 130.

Referring to FIGS. 6B and 6C together, the first light sensing cell 110 and the first color separation region 210 may correspond to the first pixel P1, and the fourth light sensing cell 140 and the fourth color separation region 240 may correspond to the other first pixel P1. Furthermore, the second light sensing cell 120 and the second color separation region 220 may correspond to the second pixel P2, and the third light sensing cell 130 and the third color separation region 230 may correspond to the third pixel P3.

Furthermore, as shown in FIG. 6C, the first nano post NPT and the second nano post NP2 having different cross-sectional areas may be disposed at the center of the first pixel P1, the second pixel P2, and the third pixel P3. Furthermore, the first nano post NPT and the second nano post NP2 may also be disposed on the center of boundary between pixels and at the intersection of the boundary between pixels, respectively. A cross-sectional area of the second nano post NP2 disposed at the boundary between pixels may be smaller than a cross-sectional area of the first nano post NP1 disposed at the center of pixels.

FIG. 6D illustrates in detail the arrangement of the first nano posts NPT and the second nano posts NP2 of the first to fourth color separation regions 210, 220, 230, and 240 constituting the partial region of FIG. 6C (e.g., the unit pattern array). For example, in FIG. 6D, the first nano posts NPT and the second nano posts NP2 are denoted by p1 to p9 according to detailed positions within the unit pattern array. The first nano post NPT may be a nano post disposed at the center of the unit pattern array, and the second nano post NP2 may be a nano post surrounding the first nano post NP1 within the unit pattern array. Specifically, the first nano posts NPT are denoted by p1, p2, p3, and p4, and the second nano posts NP2 are denoted by p5, p6, p7, p8, and p9. As illustrated in FIG. 6D, first nano posts NPT p1, p2, and p3 each have different cross-sectional areas. As understood by one of ordinary skill in the art, the cross-sectional areas of the nano posts may be the same or varied from each other.

More specifically, referring to FIG. 6D, among the nano posts NPT and NP2, the cross-sectional area of the first nano post p1 disposed at the center of the first color separation region 210 and the first nano post p4 disposed at the center of the fourth color separation region 240 may be larger than the cross-sectional area of the first nano post p2 disposed at the center of the second color separation region 220 or the first nano post p3 disposed at the center of the third color separation region 230. Furthermore, the cross-sectional area of the first nano post p2 disposed at the center of the second color separation region 220 may be larger than the cross-sectional area of the first nano post p3 disposed at the center of the third color separation region 230. However, this configuration is merely one example, and nano posts of various shapes, sizes, and arrangements may be applied as needed. As understood by one of ordinary skill in the art, the cross-sectional area may correspond to the cross-sectional area of the first nano post NPT and the second nano post NP2 perpendicular to the third direction (Z direction).

According to one or more embodiments, the second nano posts NP2 provided in the first and fourth color separation regions 210 and 240 corresponding to the first pixel P1 may have different distribution rules in the first direction (X direction) and the second direction (Y direction). For example, the second nano posts NP2 disposed in the first and fourth color separation regions 210 and 240 may have different size arrangements in the first direction (X direction) and the second direction (Y direction). For example, as shown in FIG. 6D, among the second nano posts NP2, the cross-sectional area of the second nano post p5 positioned at the boundary between the first color separation region 210 and the second color separation region 220 adjacent thereto in the first direction (X direction) may be different from the cross-sectional area of the second nano post p6 positioned at the boundary between the first color separation region 210 and the third color separation region 230 adjacent thereto in the second direction (Y direction). Similarly, the cross-sectional area of the second nano post p7 positioned at the boundary between the fourth color separation region 240 and the third color separation region 230 adjacent thereto in the first direction (X direction) may be different from the cross-sectional area of the second nano post p8 positioned at the boundary between the fourth color separation region 240 and the second color separation region 220 adjacent thereto in the second direction (Y direction).

In one or more examples, the second nano posts NP2 disposed in the second color separation region 220 corresponding to the second pixel P2 and the third color separation region 230 corresponding to the third pixel P3 may have symmetrical distribution rules in the first direction (X direction) and the second direction (Y direction). For example, as shown in FIG. 6D, among the second nano posts NP2, the cross-sectional area of the second nano post p5 disposed at the boundary between the second color separation region 220 and a pixel adjacent thereto in the first direction (X direction) may be the same as the cross-sectional area of the second nano post p8 disposed at the boundary between the second color separation region 220 and a pixel adjacent thereto in the second direction (Y direction), and the cross-sectional area of the second nano post p7 disposed at the boundary between the third color separation region 230 and a pixel adjacent thereto in the first direction (X direction) may be the same as the cross-sectional area of the second nano post p6 disposed at the boundary between the third color separation region 230 and a pixel adjacent thereto in the second direction (Y direction).

In one or more examples, all the second nano posts p9 disposed at four corners of the first color separation region 210, the second color separation region 220, the third color separation region 230, and the fourth color separation region 240 (e.g., positions where the four regions intersect with each other), may have the same cross-sectional area. Such a distribution may be caused by a pixel arrangement similar to the Bayer pattern. While the first pixels P1, which are the same as each other, are adjacent to the second pixel P2 and the third pixel P3 in the first direction (X direction) and the second direction (Y direction), the second pixel P2 and the third pixel P3, which are different from each other, may be adjacent to a respective first pixel P1 corresponding to the first color separation region 210 in the first direction (X direction) and the second direction (Y direction), and the third pixel P3 and the second pixel P2, which are different from each other, may be adjacent to a respective first pixel P1 corresponding to the fourth color separation region 240 in the first direction (X direction) and the second direction (Y direction). Furthermore, the first pixels P1, which are the same as each other, may be adjacent to the first pixels P1 corresponding to the first color separation region 210 and the fourth color separation region 240 in four diagonal directions, the third pixels P3 which are the same as each other may be adjacent to the second pixel P2 corresponding to the second color separation region 220 in four diagonal directions, and the second pixels P2, which are the same as each other may be adjacent to the third pixel P3 corresponding to the third color separation region 230 in four diagonal directions.

Accordingly, the second nano posts NP2 may be arranged in the shape of a 4-fold symmetry in the second color separation region 220 and the third color separation region 230 corresponding to the second pixel P2 and the third pixel P3, respectively, and the second nano posts NP2 may be arranged in the shape of a 2-fold symmetry in the first and fourth color separation regions 210 and 240, respectively, corresponding to the first pixel P1. In particular, the first color separation region 210 and the fourth color separation region 240 may be rotated by 90° relative to each other.

The plurality of nano posts NP1 and NP2 are all illustrated as having a symmetric circular cross-sectional shape, but the embodiments are not limited to this configuration. For example, some of the nano posts NP1 and NP2 may have an asymmetric cross-sectional shape. Specifically, the first color separation region 210 and the fourth color separation region 240 corresponding to the first pixel P1 may include the nano posts NPT and NP2 having an asymmetric cross-sectional shape of different widths in the first direction (X direction) and in the second direction (Y direction), and the second color separation region 220 and the third color separation region 230 corresponding to the second pixel P2 and the third pixel P3, respectively, may include the nano posts NP1 and NP2 having a symmetric cross-sectional shape of the same width in the first direction (X direction) and in the second direction (Y direction).

The arrangement rule of the nano prism 200 is an example of an implementation in which the target phase distribution of diverging and condensing light of the first spectrum onto the first light sensing cell 110 and the fourth light sensing cell 140, diverging and condensing light of the second spectrum onto the second light sensing cell 120, and diverging and condensing light of the third spectrum onto the third light sensing cell 130 is achieved at the position immediately after the light passes through the nano prism 200. However, the arrangement rule of the nano prism 200 is not limited to the illustrated pattern.

The shapes, sizes, and arrangements of the nano posts NP1 and NP2 provided in each region of the nano prism 200 may be determined so that at the position where light passes through the nano prism 200, a phase in which light of the first wavelength is condensed onto the first light sensing cell 110 and the fourth light sensing cell 140 is formed, and a phase in which the light of the first wavelength is not condensed onto the second light sensing cell 120 and the third light sensing cell 130 adjacent to the first light sensing cell 110 and the fourth light sensing cell 140 is formed.

Similarly, the shapes, sizes, and arrangements of the nano posts NP1 and NP2 provided in each region of the nano prism 200 may be determined so that at the position where light passes through the nano prism 200, a phase in which light of the second wavelength is condensed onto the second light sensing cell 120 is formed, and a phase in which the light of the second wavelength is not condensed onto the first light sensing cell 110, the third light sensing cell 130, and the fourth light sensing cell 140 adjacent to the second light sensing cell 120 is formed.

Furthermore, the shapes, sizes, and arrangements of the nano posts NP1 and NP2 provided in each region of the nano prism 200 may be determined so that at the position where light passes through the nano prism 200, a phase in which light of the third wavelength is condensed onto the third light sensing cell 130 is formed, and a phase in which the light of the third wavelength is not condensed onto the first light sensing cell 110, the second light sensing cell 120, and the fourth light sensing cell 140 adjacent to the third light sensing cell 130 is formed.

In the image sensor 1000 of the present one or more embodiments, the optical length OL between the light detector 100 and the nano prism 200 in the pixel array 1100 may vary. Accordingly, light divergence according to wavelengths due to the shapes, sizes, and arrangements of the nano posts NP1 and NP2 may correspond to a configuration of the optical length OL under certain conditions. The shapes, sizes, and/or arrangements of the nano posts NPT and NP2 that satisfy all of these conditions may be determined, and the nano prism 200 may cause light immediately after passing through the nano prism 200 to have the following target phase distribution. For example, at the position immediately after the light passes through the nano prism 200 (e.g., at the lower surface of the nano prism 200 or the upper surface of the variable interlayer 310), the phase of the light of the first wavelength may represent $2N\pi$ at the center of the first color separation region 210 corresponding to the first light sensing cell 110 and the center of the fourth color separation region 240 corresponding to the fourth light sensing cell 140. Furthermore, the phase of the light of the first wavelength may represent $(2N-1)\pi$ at the center of the second color separation region 220 corresponding to the second light sensing cell 120 and the center of the third color separation region 230 corresponding to the third light sensing cell 130. In one or more examples, N is an integer greater than 0. Therefore, the phase of light of the first wavelength at the position immediately after passing through the nano prism 200 may be maximized at the center of the first color separation region 210 and the center of the fourth color separation region 240, may gradually be reduced in a concentric circle shape away from the center of the first color separation region 210 and the center of the fourth color separation region 240, and may be minimized at the center of the second color separation region 220 and the center of the third color separation region 230. Specifically, for example, when N=1, at the position after the light passes through the nano prism 200, the phase of the light of the first wavelength may be $2\pi$ at the center of the first color separation region 210 and the center of the fourth color separation region 240, and may be $\pi$ at the center of the second color separation region 220 and the center of the third color separation region 230. In one or more examples, the phase of the light may refer to a relative phase value with respect to a phase immediately before the light passes through the nano posts NP1 and NP2.

Furthermore, at the position immediately after the light passes through the nano prism 200, the phase of the light of the second wavelength may be $2M\pi$ at the center of the second color separation region 220 corresponding to the second light sensing cell 120, and may be $(2M-1)\pi$ at the center of the first color separation region 210 corresponding to the first light sensing cell 110 and the center of the fourth color separation region 240 corresponding to the fourth light sensing cell 140. Furthermore, the phase of the light of the second wavelength may be larger than $(2M-2)\pi$ and smaller than $(2M-1)\pi$ at the center of the third color separation region 230 corresponding to the third light sensing cell 130. In one or more examples, M is an integer greater than 0. Therefore, at the position immediately after the light passes through the nano prism 200, the phase of the light of the second wavelength may be maximized at the center of the second color separation region 220, may gradually be reduced in a concentric circle shape away from the center of the second color separation region 220, and may be locally minimized at the center of the first color separation region 210, the fourth color separation region 240, and the third color separation region 230. Specifically, for example, when M=1, at the position after the light passes through the nano prism 200, the phase of the light of the second wavelength may be 2π at the center of the second color separation region 220, may be a at the center of the first color separation region 210 and the center of the fourth color separation region 240, and may be about 0.2π to about 0.7π at the center of the third color separation region 230.

In one or more examples, at the position immediately after the light passes through the nano prism 200, the phase of light of the third wavelength may be 2Lπ at the center of the third color separation region 230 corresponding to the third light sensing cell 130, may be (2L−1)π at the center of the first color separation region 210 corresponding to the first light sensing cell 110 and the center of the fourth color separation region 240 corresponding to the fourth light sensing cell 140, and may be larger than (2L−2)π and smaller than (2L−1)π at the center of the second color separation region 220 corresponding to the second light sensing cell 120. In one or more examples, L is an integer greater than 0. Therefore, at the position immediately after the light passes through the nano prism 200, the phase of light of the third wavelength may be maximized at the center of the third color separation region 230, may gradually be reduced in a concentric circle shape away from the center of the third color separation region 230, and may be locally minimized at the center of the first color separation region 210, the fourth color separation region 240, and the second color separation region 220. Specifically, for example, when L=1, at the position after the light passes through the nano prism 200, the phase of the third wavelength may be 2π at the center of the third color separation region 230, may be π at the center of the first color separation region 210 and the center of the fourth color separation region 240, and may be about 0.2π to about 0.7π at the center of the second color separation region 220.

The light of the first wavelength, the light of the second wavelength, and the light of the third wavelength may be green light, blue light, or red light, respectively. However, the present disclosure is not limited these colors, and may include any additional suitable colors. As mentioned above, the target phase distribution may refer to a phase distribution at a position immediately after the light passes through the nano prism 200. For example, when the light of such a phase distribution travels toward the first through fourth light sensing cells 110, 120, 130, and 140, different wavelength spectrums may be formed according to the travel distance. In one or more examples, as the optical length OL between the nano prism 200 and the light detector 100 is adjusted, light of different wavelength spectrums may be condensed onto the first through fourth light sensing cells 110, 120, 130, and 140.

FIGS. 7A to 7D are cross-sectional views of pixel arrays in image sensors according to some embodiments. The descriptions already given in FIGS. 1 to 6D are briefly provided or omitted.

Figure 7A:
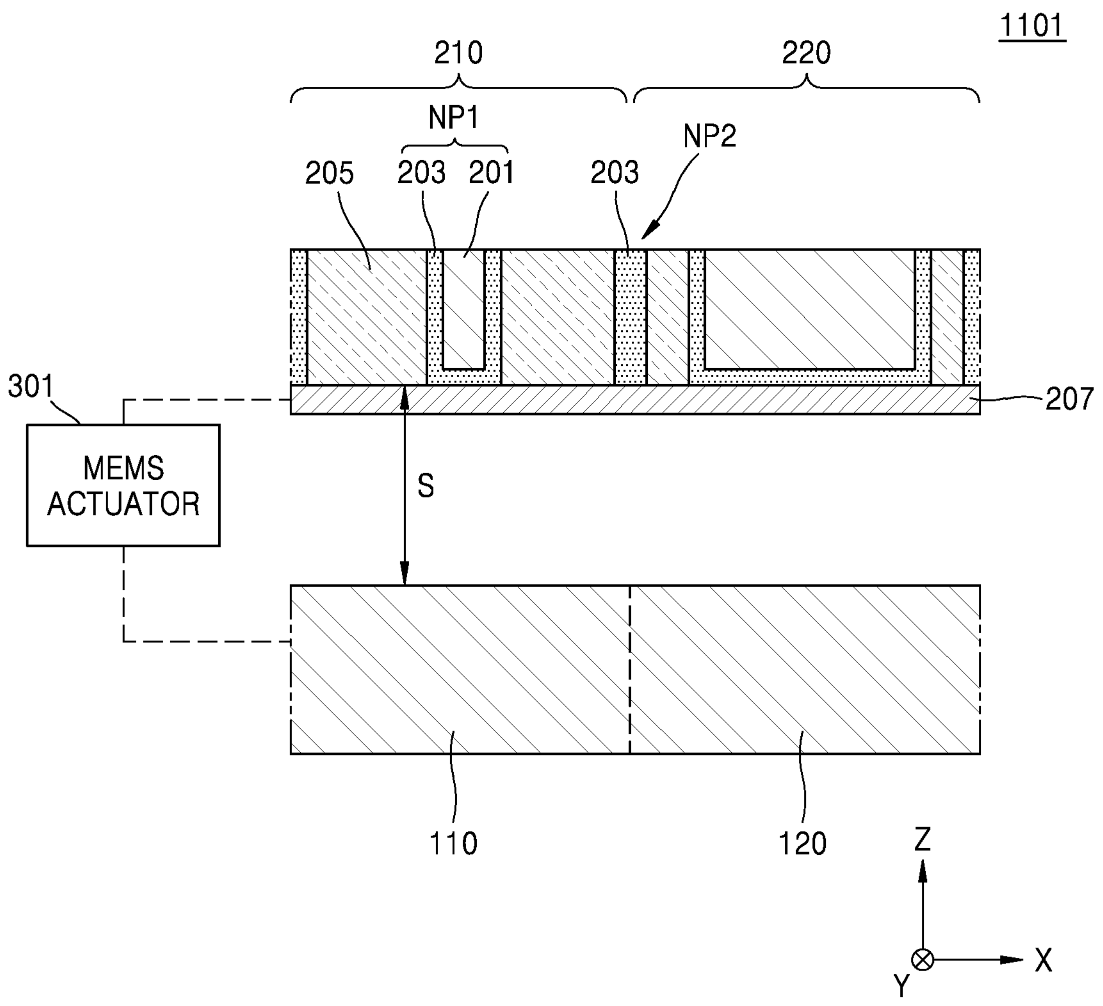
FIGS. 7A to 7D are cross-sectional views of pixel arrays in image sensors, according to some embodiments.

Referring to FIG. 7A, in the image sensor 1000 of the present one or more embodiments, a pixel array 1101 may include the light detector 100, the nano prism 200, and the variable interlayer device 301. The variable interlayer device 301 may be configured as a MEMS actuator that varies the physical distance S between the nano prism 200 and the light detector 100. A medium between the nano prism 200 and the light detector 100 may be, for example, air. Accordingly, a support layer 207 may be provided to support the nano posts NP1 and NP2.

The support layer 207 and the light detector 100 may be electrically and mechanically connected to the variable interlayer device 301, so that the position of the support layer 207 may vary with respect to the light detector 100 according to the driving of the variable interlayer device 301. Accordingly, the physical distance S between the nano prism 200 and the light detector 100 may be adjusted. For example, the MEMS actuator may move the support layer 207 upwards in a vertical direction to increase the physical distance S. The MEMs actuator may further move the support layer 207 downwards in the vertical direction to decrease the physical distance S. In one or more examples, the MEMS actuator 301 may be motor having a shaft coupled to the support layer 207 such that actuation of the shaft causes the support layer to move upwards or downwards in the physical direction.

Figure 7B:
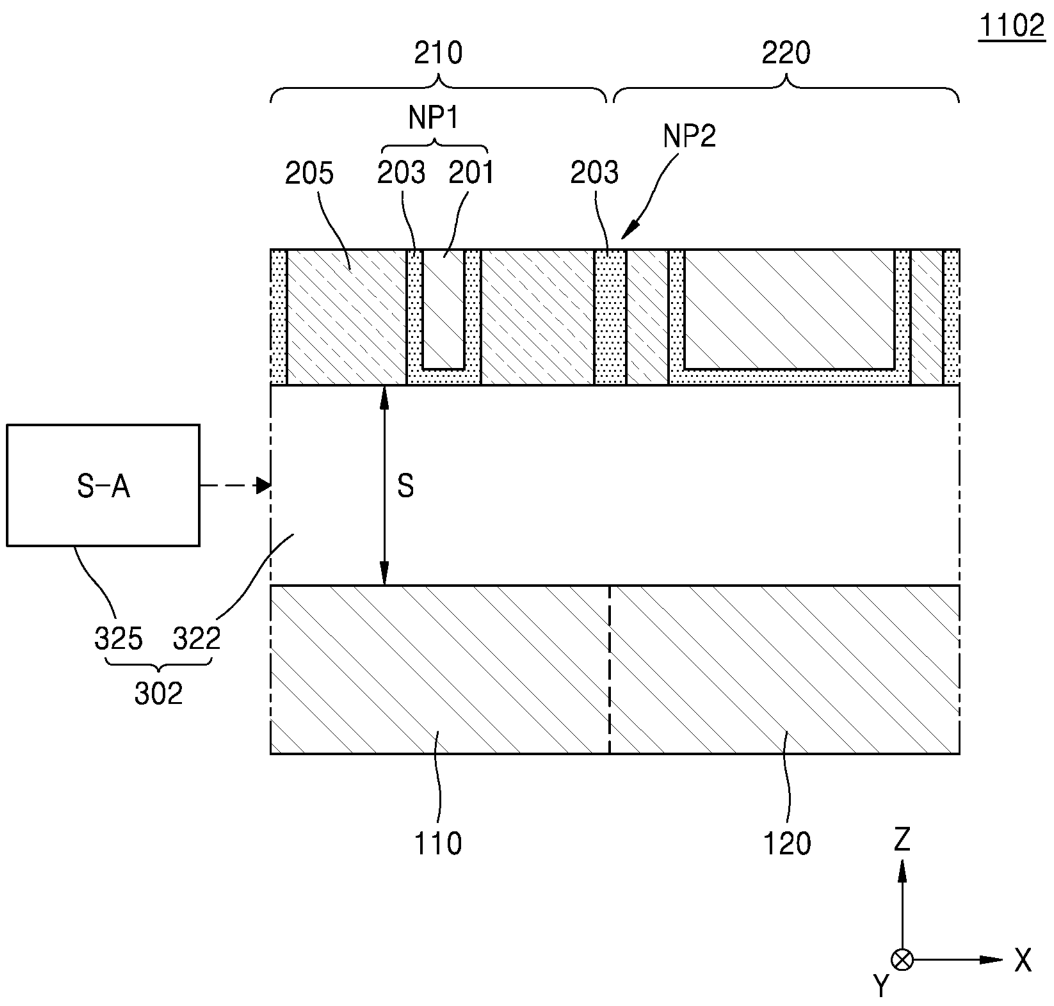

Referring to FIG. 7B, in the image sensor 1000 of the present one or more embodiments, a pixel array 1102 may include the light detector 100, the nano prism 200, and a variable interlayer device 302. The variable interlayer device 302 may include a shape variable structure 322 and a signal application unit 325 to vary the physical distance S between the nano prism 200 and the light detector 100.

The shape variable structure 322 may include a shape variable material having shape varying characteristics according to an electrical signal. Furthermore, the signal application unit 325 may apply an electrical signal to the shape variable structure 322. The shape variable material of the shape variable structure 322 may vary according to the signal applied from the signal application unit 325, so that the physical distance S between the light detector 100 and the nano prism 200 may vary. For example, when the electrical signal is applied, the shape variable structure 322 increased in height, thereby causing the physical distance S to increase. Furthermore, when the electrical signal is not applied or supply of the electrical signal is stopped, the shape variable structure 322 decreases in height, thereby causing the physical distance S to decrease.

A shape variable material included in the shape variable structure 322 may use, for example, a shape memory alloy (SMA) or an electro-active polymer. The shape variable structure 322 may be embodied in various forms. For example, the shape variable structure 322 may have various shapes in which the shape variable material layer and a fixing member supporting the shape variable material layer are combined. However, the present disclosure is not limited thereto. For example, the shape variable structure 322 may entirely include a shape variable material layer.

Figure 7C:
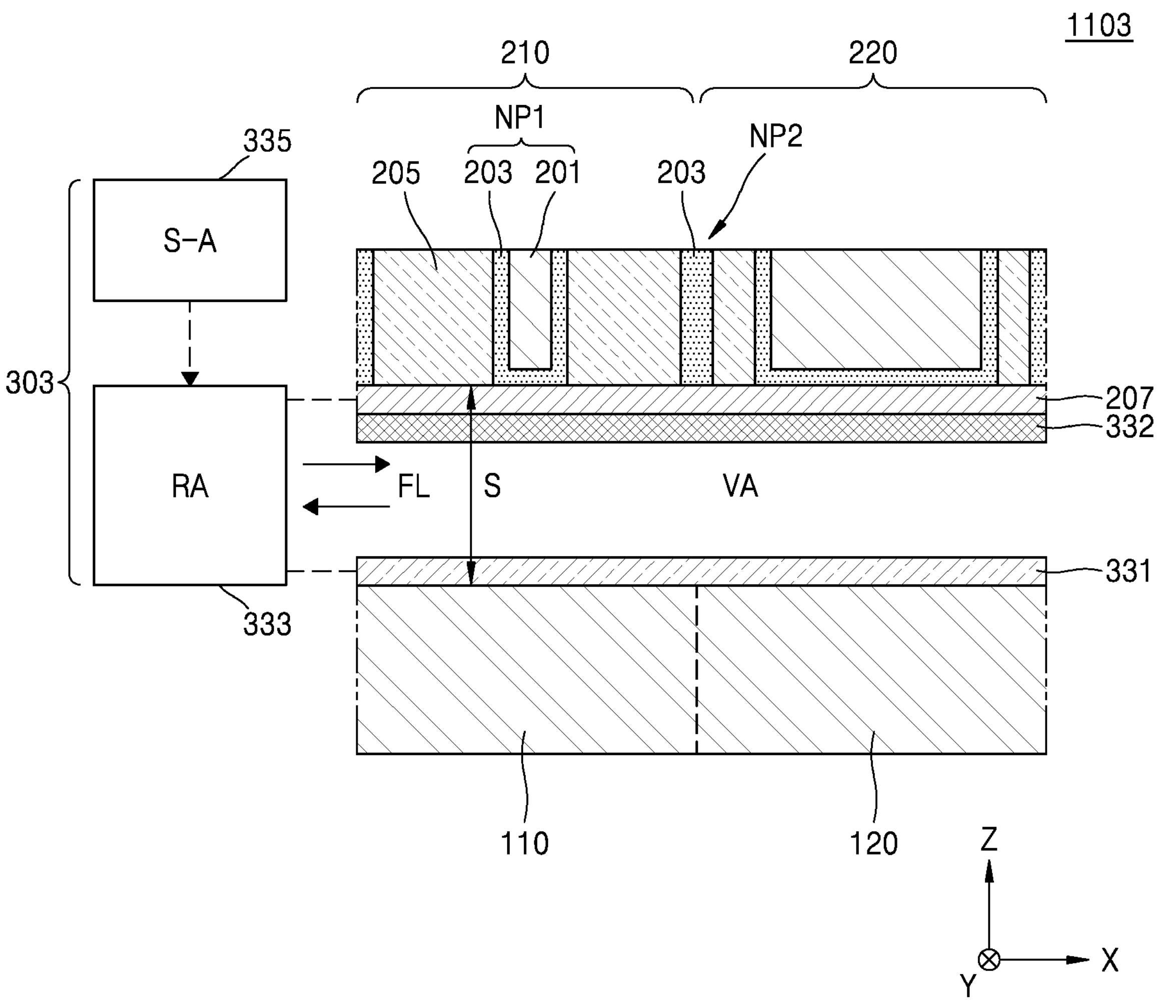

Referring to FIG. 7C, in the image sensor 1000 of the present one or more embodiments, a pixel array 1103 may include the light detector 100, the nano prism 200, and a variable interlayer device 303. The variable interlayer device 303 may include a reservoir region 333, a frame structure, and a signal application unit 335. The frame structure may include a height variable region VA. The signal application unit 335 may apply a signal to make an optical fluid FL within the reservoir region 333 flowing to the height variable region VA.

The height variable region VA may refer to a region between the nano prism 200 and the light detector 100. The height variable region VA may include an elastic membrane 332 and a fixing member 331. The fixing member 331 may support the elastic deformation of the elastic membrane 332. The elastic membrane 332, the fixing member 331, the reservoir region 333, and the height variable region VA may constitute one frame structure.

The signal application unit 335 may apply a hydraulic pressure signal to the reservoir region 333 to move the optical fluid FL to the height variable region VA. Furthermore, an additional component such as an electrode for fluid flow may be further provided in the reservoir region 333 or the height variable region VA, and the signal application unit 535 may apply an electrical signal to the additional component to make the optical fluid FL flowing.

When the optical fluid FL flows between the reservoir region 333 and the height variable region VA, the elastic membrane 332 of the height variable region VA may be elastic according to the amount of the optical fluid FL, and the height of the height variable region VA may be adjusted. As the height of the height variable region VA is adjusted, the physical distance S between the nano prism 200 and the light detector 100 may be adjusted. For example, by increasing the optical fluid FL in the height variable region VA, the support layer 207 moves upward in the vertical direction, and by decreasing the optical fluid FL in the height variable region VA to increase the physical distance S, the support layer 207 moves downward in the vertical direction to decrease the physical distance S. FIG. 7C illustrates the support layer 207 supporting the nano posts NP1 and NP2, but the present disclosure is not limited thereto. For example, the support layer 207 may be omitted and the nano posts NP1 and NP2 may be directly supported by the elastic membrane 332. The optical fluid FL may include transparent oil or the like, and may include various liquid materials.

Figure 7D:
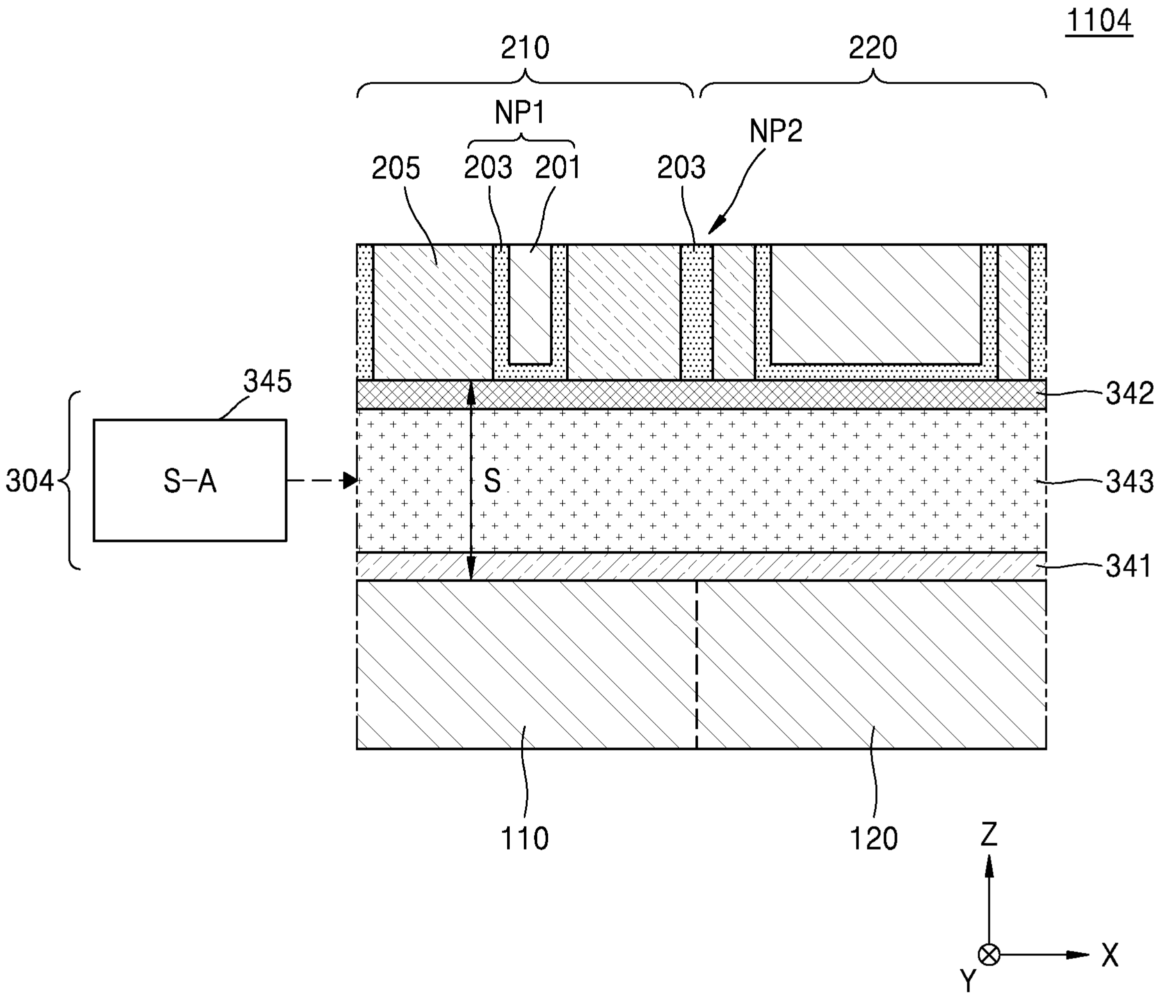

Referring to FIG. 7D, in the image sensor 1000 of the present one or more embodiments, a pixel array 1104 may include the light detector 100, the nano prism 200, and a variable interlayer device 304. The variable interlayer device 304 may include a refractive index variable layer 343 having a refractive index changing according to an input signal from the outside, transparent electrodes 341 and 342, and a signal application unit 345. The transparent electrodes 341 and 342 may be disposed on the upper and lower surfaces of the refractive index variable layer 343. The signal application unit 345 may apply an electrical signal to the refractive index variable layer 343. The refractive index of the refractive index variable layer 343 may change according to the signal applied from the signal application unit 345, and the optical length OL represented by the product of the refractive index and the physical distance S may vary.

The refractive index variable layer 343 may include a material that optically changes according to an electrical signal. The refractive index variable layer 343 may include, for example, an electro-optic material in which an effective permittivity changes when an electric signal is applied and a refractive index changes. $LiNbO_3$, $LiTaO_3$, potassium tantalate niobate (KTN), lead zirconate titanate (PZT), liquid crystal, or any other suitable material known to one of ordinary skill in the art, may be used as the electro-optic material. Furthermore, various polymer materials having electro-optic properties may be used as the electro-optic material.

In one or more examples, the refractive index variable layer 343 is not limited to the electro-optic material, and may include a material in which when heat is applied, a phase transition occurs at a certain temperature or higher, and permittivity changes. Example materials that have a phase transition when heat is applied include, for example, $VO_2$, $VO_2O_3$, EuO, MnO, CoO, $CoO_2$, $LiCoO_2$, or $Ca_2RuO_4$. In this case, a heat generation layer may be further disposed between the signal application unit 345 and the refractive index variable layer 343. The heat generation layer may generate heat by an electric signal of the signal application unit 345 and transfer the generated heat to the refractive index variable layer 343.

Figure 8:
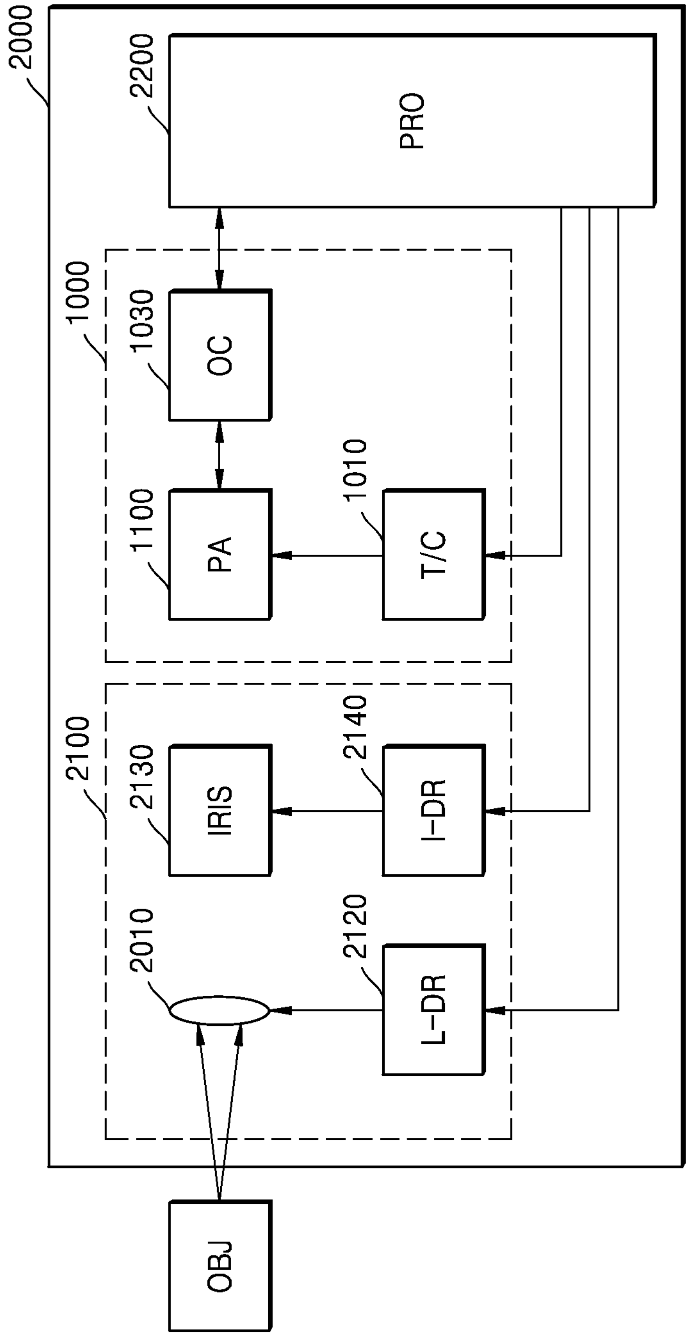
FIG. 8 is a block diagram of an electronic device including an image sensor, according to one or more embodiments.

FIG. 8 is a block diagram of an electronic device including an image sensor according to one or more embodiments. FIG. 8 will be described with reference to FIG. 1 together, and the descriptions already given in FIGS. 1 to 7D will be briefly provided or omitted.

Referring to FIG. 8, an electronic device 2000 including an image sensor according to the present one or more embodiments (e.g., referred to as an "electronic device") may include an imaging unit 2100, the image sensor 1000, and a processor 2200. The electronic device 2000 may be, for example, a camera. The imaging unit 2100 may form an optical image by focusing light reflected from an object OBJ. The imaging unit 2100 may include an objective lens 2010, a lens driver 2120, an iris 2130, and an iris driver 2140. Although FIG. 8 illustrates only one lens, as understood by one of ordinary skill in the art, the objective lens 2010 may include a plurality of lenses having different sizes and shapes.

The lens driver 2120 may communicate information about focus detection with the processor 2200 and adjust the position of the objective lens 2010 according to a control signal provided from the processor 2200. The lens driver 1120 may move the objective lens 2010 to adjust the distance between the objective lens 2010 and the object OBJ, or adjust the positions of individual lenses of the objective lens 2010. The lens driver 1120 drives the objective lens 2010 so that the focus of the object OBJ may be adjusted. The electronic device 2000 may have an auto focus function.

The iris driver 2140 may communicate information about the amount of light with the processor 2200 and adjust the iris 2130 according to a control signal provided from the processor 2200. For example, the iris driver 2140 may increase or decrease the aperture of the iris 2130 according to the amount of light entering the camera 2000 through the objective lens 2010. Furthermore, the iris driver 2140 may adjust the opening time of the iris 2130.

The image sensor 1000 may generate an electrical image signal based on the intensity of an incident light. The image sensor 1000 may be, for example, the image sensor 1000 of FIG. 1. Accordingly, the image sensor 1000 may include the pixel array 1100, the timing controller 1010, and the output circuit 1030. Furthermore, the image sensor 1000 may further include the row decoder 1020. Light passing through the objective lens 2010 and the diaphragm 2130 may form an image of the object OBJ on the light receiving surface of the pixel array 1100. The pixel array 1100 may be a CCD or CMOS that converts an optical signal into an electrical signal. The pixel array 1100 may include additional pixels for performing an AF function or a distance measurement function.

The processor 2200 may control overall operations of the camera 2000 and may have an image processing function. For example, the processor 2200 may provide a control signal for the operation of a component to each of the lens driver 2120, the iris driver 2140, the timing controller 1010, etc. As described above, the pixel array 1100 of the image sensor 1000 may have a structure in which the optical length OL between the light detector 100 and the nano prism 200 is adjusted as discussed above. Accordingly, the electronic device 2000 of the present one or more embodiments may form an image using a plurality of optical signal sets obtained at a plurality of optical lengths based on the image sensor 1000, and may obtain an image of high quality with a high color purity and an excellent reproducibility.

FIGS. 9A to 9E are cross-sectional views schematically illustrating a process of a manufacturing method of an image sensor according to one or more embodiments. FIGS. 9A to 9E will be described with reference to FIGS. 2 to 4, and descriptions already given in FIGS. 1 to 8 will be briefly provided or omitted.

Referring to FIG. 9A, the light detector 100 and the variable interlayer 310 are formed on a substrate. The light detector 100 may include a plurality of light sensing cells. The variable interlayer 310 may be included in the interlayer device 300. Components included in the variable interlayer devices 301, 302, 303, and 304 of FIGS. 7A to 7D may be formed on the light detector 100, instead of the variable interlayer 310.

Thereafter, a first material layer for a spacer layer is formed on the variable interlayer 310. The first material layer may include a low refractive index material, such as $SiO_2$. However, the material of the first material layer is not limited to $SiO_2$ and may include any other suitable material known to one of ordinary skill in the art. Subsequently, a photo-resist (PR) pattern is formed on the first material layer through a photo process, and the spacer layer 205 is formed by etching the first material layer using the PR pattern as a mask. In this regard, the spacer layer 205 may include a first recess R1 and a second recess R2 forming a first nano post and a second nano post, respectively.

Referring to FIGS. 9B, 9C, and 9D, the second material layer 203*a* may be deposited on the spacer layer 205. Specifically, the second material layer 203*a* may be deposited by an ALD process. The second material layer 203*a* may include $TiO_2$ doped with aluminum or silicon (Si) at a second doping concentration. However, the present disclosure is not necessarily limited to the above disclosed materials, and may include other materials doped with aluminum or silicon. The second material layer 203*a* may fill partly the first recess R1 and wholly the second recess R2 shown in FIG. 9A. Thereafter, the third material layer 201*a* may be deposited on the second material layer 203*a* as illustrated in FIG. 9C. Specifically, the third material layer 201*a* may be deposited by an ALD process. The third material layer 201*a* may be doped with aluminum or silicon at a first doping concentration. The third material layer 201*a* may fill the remaining empty space of the first recess R1 that is not filled by the second material layer 203*a*. Thereafter, the third refractive layer 209 may be deposited on the third material layer 201*a* as illustrated in FIG. 9D. Specifically, the third refractive layer 209 may be deposited by an ALD process. The third refractive layer 209 may be doped with aluminum or silicon at a third doping concentration. The third refractive layer 209 may be deposited on the third material layer 201*a* without filling the empty space of a recess region.

According to one or more embodiments, when $TiO_2$ is doped with aluminum or silicon, a deposition rate of $TiO_2$ by the ALD process may increase. In this regard, as the concentration of aluminum or silicon doping increases, the deposition rate of $TiO_2$ may increase proportionally. Furthermore, as the concentration of aluminum or silicon doping with respect to $TiO_2$ increases, the refractive index of $TiO_2$ may decrease. However, the present disclosure is not necessarily limited to the above disclosed materials, and the first refractive layer 201, the second refractive layer 203, and the third refractive layer 209 may include other materials doped with aluminum or silicon.

Figure 9E:
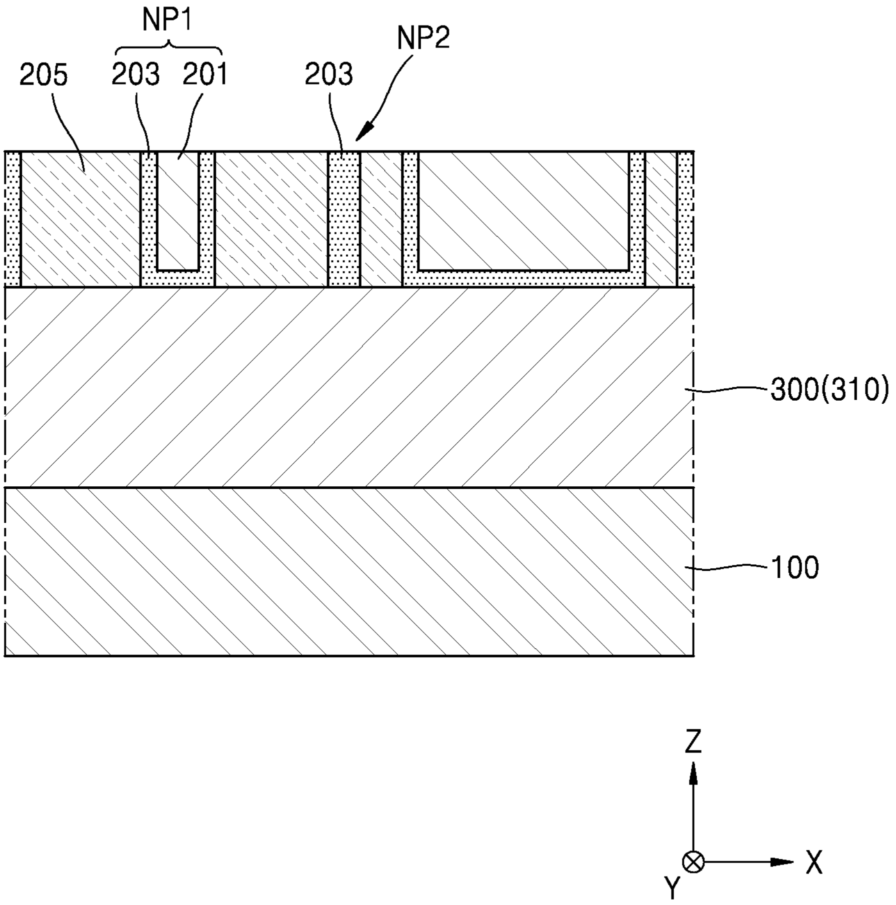

Referring to FIG. 9E, after the third refractive layer 209 is formed, the first nano post NPT and the second nano post NP2 are formed through a CMP process. In the CMP process, the spacer layer 205 may act as an etch stop layer. Through the CMP process, the third material layer 201*a* may be separated into a plurality of first refractive layers 201, and the second material layer 203*a* may be separated into a plurality of second refractive layers 203. The third refractive layer 209 may be completely removed through a CMP process.

While the present disclosure has been particularly shown and described with reference to embodiments thereof, it will be understood that various changes in form and details may be made therein without departing from the spirit and scope of the following claims.

What is claimed is:

1. An image sensor comprising:

a light detector disposed on a substrate, the light detector comprising a plurality of light sensing cells;

an interlayer device disposed on the light detector, the interlayer device configured to transmit a light; and a nano prism comprising a first nano post and a second nano post spaced apart from each other on the interlayer device, the nano prism configured to condense a light onto the light detector, wherein the first nano post comprises;

a first refractive layer doped with aluminum at a first doping concentration, and a second refractive layer surrounding a bottom surface and a side surface of the first refractive layer, the second refractive layer doped with aluminum at a second doping concentration, and wherein the first doping concentration is higher than the second doping concentration.

2. The image sensor of claim 1, wherein the first doping concentration of the first refractive layer is about 5% to about 30%, the first doping concentration corresponding to a percentage of the first refractive layer that contains aluminum, and wherein the second doping concentration of the second refractive layer is about 10% at a maximum, the second doping concentration corresponding to a percentage of the second refractive layer that contains aluminum.

3. The image sensor of claim 1, wherein the second refractive layer has a higher refractive index than the first refractive layer.

4. The image sensor of claim 1, wherein upon the light from an outer layer being incident to the interlayer device through the first refractive layer and the second refractive layer of the first nano post, the nano prism is configured such that a first angle of incidence at an interface between the outer layer and the first refractive layer is greater than a second angle of incidence at an interface between the first refractive layer and the second refractive layer.

5. The image sensor of claim 1, wherein a thickness of the second nano post is constant in a direction perpendicular to an upper surface of the interlayer device.

6. The image sensor of claim 1, wherein each of the first nano post and the second nano post has a cylindrical shape, and an area of an upper surface of the first nano post is larger than an area of an upper surface of the second nano post.

7. The image sensor of claim 1, further comprising: a spacer layer arranged between the first nano post and the second nano post, the spacer layer contacting the first nano post and the second nano post.

8. The image sensor of claim 7, wherein an upper surface of the first refractive layer, an upper surface of the second refractive layer, and an upper surface of the spacer layer have substantially a same vertical level.

9. The image sensor of claim 1, wherein each of the first refractive layer and the second refractive layer comprises $SiN_3$, $Si_3N_4$, ZnS, GaN, ZnSe, $TiO_2$, or a combination thereof.

10. The image sensor of claim 1, wherein the nano prism comprises a plurality of color separation regions each corresponding to a respective light sensing cell from the plurality of light sensing cells, wherein each of the plurality of color separation regions comprises at least one first nano post and at least one second nano post, and wherein the plurality of color separation regions condense light of different wavelength spectrums onto adjacent light sensing cells among the plurality of light sensing cells.

11. An image sensor comprising:

a light detector disposed on a substrate, the light detector comprising a plurality of light sensing cells;

an interlayer device disposed on the light detector, the interlayer device configured to transmit a light; and a nano prism comprising a first nano post and a second nano post spaced apart from each other on the interlayer device, the nano prism configured to condense a light onto the light detector, wherein the first nano post comprises a first refractive layer doped with aluminum at a first doping concentration and a second refractive layer surrounding a bottom surface and a side surface of the first refractive layer, the second refractive layer doped with aluminum at a second doping concentration, wherein the first doping concentration is higher than the second doping concentration, wherein the second refractive layer has a higher refractive index than the first refractive layer, wherein upon the light from an outer layer being incident to the interlayer device through the first refractive layer and the second refractive layer of the first nano post, the nano prism is configured such that a first angle of incidence at an interface between the outer layer and the first refractive layer is greater than a second angle of incidence at an interface between the first refractive layer and the second refractive layer, wherein each of the first refractive layer and the second refractive layer comprises $SiN_3$, $Si_3N_4$, ZnS, GaN, ZnSe, $TiO_2$, or a combination thereof, wherein the first doping concentration of the first refractive layer is about 5% to about 30%, the first doping concentration corresponding to a percentage of the first refractive layer that contains aluminum, and wherein the second doping concentration of the second refractive layer is 0% to about 10%, the second doping concentration corresponding to a percentage of the second refractive layer that contains aluminum, wherein each of the first nano post and the second nano post has a cylindrical shape, an upper surface of the first nano post is wider than an upper surface of the second nano post, and each of the first nano post and the second nano post has a height or diameter smaller than a wavelength of a visible light, and wherein the nano prism comprises a plurality of color separation regions each corresponding to a respective light sensing cell form the plurality of light sensing cells, each of the plurality of color separation regions comprises at least one first nano post and at least one second nano post, and the plurality of color separation regions condense light of different wavelength spectrums onto adjacent light sensing cells among the plurality of light sensing cells.

12. The image sensor of claim 11, further comprising: a spacer layer arranged between the first nano post and the second nano post and contacting the first nano post and the second nano post, wherein an upper surface of the first refractive layer, an upper surface of the second refractive layer, and an upper surface of the spacer layer have substantially a same vertical level, and the spacer layer comprises silicon oxide.

* * * * *